United States Patent
Giusti et al.

(10) Patent No.: US 11,541,653 B2
(45) Date of Patent: Jan. 3, 2023

(54) MICROFLUIDIC DEVICE FOR CONTINUOUS EJECTION OF FLUIDS, IN PARTICULAR FOR INK PRINTING, AND RELATED MANUFACTURING PROCESS

(71) Applicant: STMICROELECTRONICS S.R.L., Agrate Brianza (IT)

(72) Inventors: Domenico Giusti, Caponago (IT); Andrea Nicola Colecchia, Agrate Brianza (IT); Gaetano Santoruvo, Corsico (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 148 days.

(21) Appl. No.: 16/882,215

(22) Filed: May 22, 2020

(65) Prior Publication Data
US 2020/0369023 A1 Nov. 26, 2020

(30) Foreign Application Priority Data
May 24, 2019 (IT) .......................... 102019000007196

(51) Int. Cl.
*B41J 2/03* (2006.01)
*H01L 27/20* (2006.01)
(Continued)

(52) U.S. Cl.
CPC .............. *B41J 2/03* (2013.01); *H01L 27/20* (2013.01); *H01L 41/0973* (2013.01); *H01L 41/314* (2013.01)

(58) Field of Classification Search
None
See application file for complete search history.

(56) References Cited

U.S. PATENT DOCUMENTS

| 6,502,930 B1 | 1/2003 | Shimada et al. |
| 2004/0088859 A1 | 5/2004 | Ito et al. |

(Continued)

FOREIGN PATENT DOCUMENTS

| CN | 101007462 A | 8/2007 |
| CN | 106926582 A | 7/2017 |

(Continued)

*Primary Examiner* — Erica S Lin
(74) *Attorney, Agent, or Firm* — Seed IP Law Group LLP

(57) ABSTRACT

A microfluidic device for continuous ejection of fluids includes: a semiconductor body that laterally delimits chambers; an intermediate structure which forms membranes each delimiting a top of a corresponding chamber; and a nozzle body which overlies the intermediate structure. The device includes, for each chamber: a corresponding piezoelectric actuator; a supply channel which traverses the intermediate structure and communicates with the chamber; and a nozzle which traverses the nozzle body and communicates with the supply channel. Each actuator is configured to operate i) in a resting condition such that the pressure of a fluid within the corresponding chamber causes the fluid to pass through the supply channel and become ejected from the nozzle as a continuous stream, and ii) in an active condition, where it causes a deformation of the corresponding membrane and a consequent variation of the pressure of the fluid, causing a temporary interruption of the continuous stream.

20 Claims, 15 Drawing Sheets

(51) Int. Cl.
*H01L 41/09* (2006.01)
*H01L 41/314* (2013.01)

(56) References Cited

U.S. PATENT DOCUMENTS

| | | |
|---|---|---|
| 2006/0103697 A1 | 5/2006 | Silverbrook |
| 2006/0109299 A1 | 5/2006 | Silverbrook |
| 2006/0197809 A1 | 9/2006 | Tobita et al. |
| 2009/0122118 A1 | 5/2009 | Bibi et al. |
| 2009/0153627 A1 | 6/2009 | Barbet et al. |
| 2010/0097423 A1 | 4/2010 | Inoue |
| 2012/0268529 A1* | 10/2012 | Baumer ............ B41J 2/03 347/54 |
| 2012/0281047 A1* | 11/2012 | Barbet ............ B41J 2/03 347/73 |
| 2013/0242000 A1 | 9/2013 | Faralli et al. |
| 2013/0284694 A1 | 10/2013 | Cai et al. |
| 2014/0313264 A1 | 10/2014 | Cattaneo et al. |
| 2017/0182778 A1 | 6/2017 | Cattaneo et al. |
| 2017/0190179 A1 | 7/2017 | Menzel et al. |
| 2018/0009229 A1 | 1/2018 | Venner et al. |
| 2018/0290450 A1 | 10/2018 | Reinten et al. |
| 2019/0023014 A1 | 1/2019 | Giusti et al. |
| 2019/0315123 A1* | 10/2019 | Nakakubo ............ B41J 2/14233 |

FOREIGN PATENT DOCUMENTS

| | | |
|---|---|---|
| JP | 2000-158645 A | 6/2000 |
| WO | WO 2005021269 A1 | 3/2005 |

\* cited by examiner

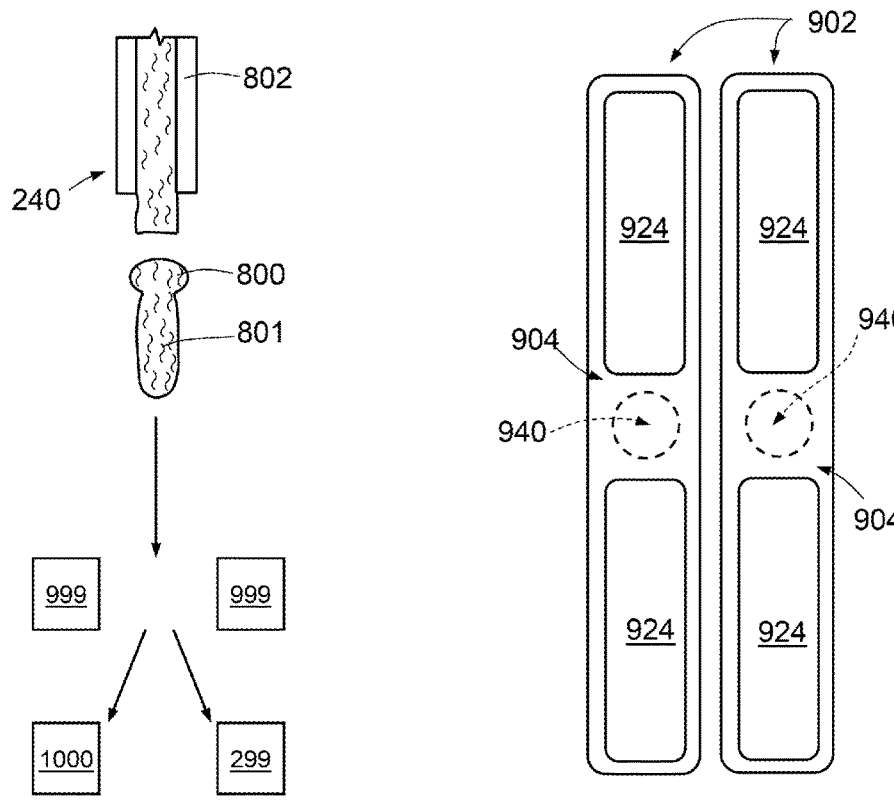
Fig.7
Fig.9
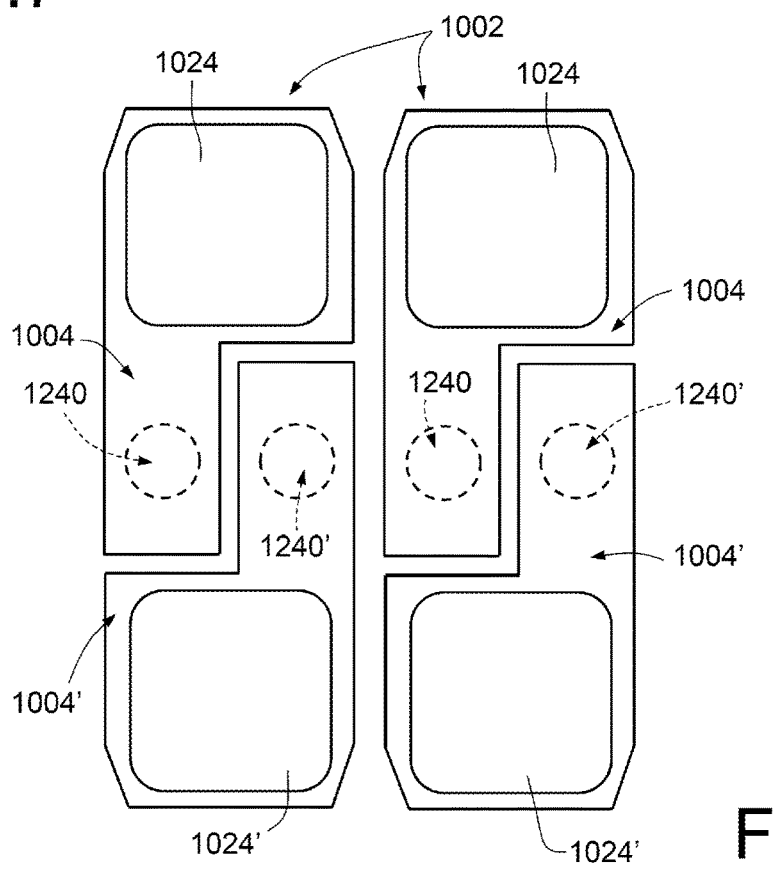
Fig.10

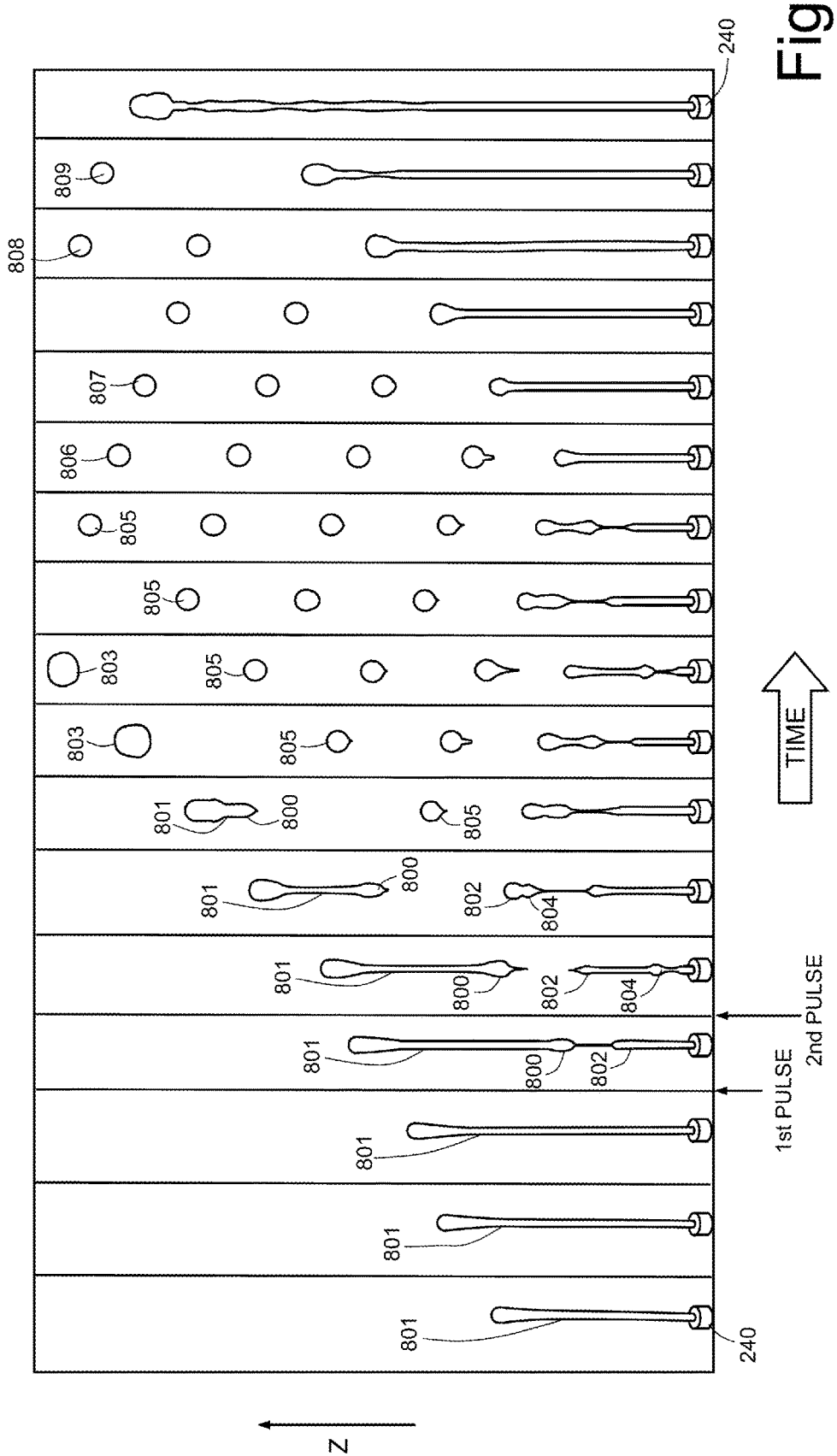

MICROFLUIDIC DEVICE FOR CONTINUOUS EJECTION OF FLUIDS, IN PARTICULAR FOR INK PRINTING, AND RELATED MANUFACTURING PROCESS

BACKGROUND

Technical Field

The present disclosure relates to a microfluidic device for the ejection of fluids, such as for ink printing, and to the related manufacturing process.

Description of the Related Art

As is known, for spraying inks, perfumes and the like, it has been proposed to use microfluidic devices of small dimensions, which can be obtained using low-cost MEMS (Micro-Electrode-Mechanical Systems) manufacturing techniques.

Typically, a microfluidic device comprises a plurality of cells, each of which comprises a chamber, adapted to contain a liquid, and a nozzle, through which the liquid can exit from the microfluidic device, in the form of droplets, in the direction of the medium to be printed.

In greater detail, microfluidic devices of the drop-on-demand (DoD) type are known, in which the cell has an actuator, typically of a thermal or piezoelectric type, which can be controlled electronically so as to force ejection of a single droplet, through the nozzle; in the absence of the action of the actuator, the liquid in the chamber does not have a sufficient pressure to enable passage of droplets through the nozzle. The actuators of the cells are therefore driven according to the desired print. Consequently, it may happen that the nozzles are not traversed by the ink for relatively long periods of time, in which case it is possible for undesired encrustations to form in the nozzles.

Likewise known are microfluidic devices of a type with continuous jet of ink, which enable ejection, through each nozzle, of a steady stream of ink. Moreover, each cell has available a respective thermal actuator, which can be controlled so as to cause perturbation of the aforementioned stream in order to cause division of the stream into droplets. In particular, the thermal actuator heats part of the stream so as to locally reduce the viscosity and the surface tension, thus causing generation, starting from the stream of ink, of a succession of droplets. The size of the droplets depends upon the duration of the heat pulses generated by the thermal actuator and upon the rate of flow. Moreover, the droplets of larger sizes are directed towards the medium to be printed, whereas the droplets of smaller sizes are recovered by a recirculation system; in other words, the droplets of smaller size are deflected before reaching the medium to be printed, and are subsequently used once again for supplying the cells of the microfluidic device.

For practical purposes, continuous-jet microfluidic devices are characterised by a low risk of clogging of the nozzles, as well as by a life cycle independent of the type of images that are printed and of the printing speed. However, such microfluidic devices presuppose the use of an ink capable of exhibiting appreciable variations of viscosity and/or of surface tension as the temperature varies. Consequently, such continuous jet microfluidic devices pose restrictions on the inks that can be used.

BRIEF SUMMARY

One aim of the present disclosure is therefore to provide a continuous-ink-jet microfluidic device that will overcome at least in part the drawbacks of the prior art.

According to the present disclosure, a MEMS microfluidic device for ejection of fluids and the related manufacturing process are provided.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein:

FIG. 7 is a schematic side view of a portion of a nozzle of the present microfluidic device, traversed by a fluid;

FIG. 8 shows a sequence of seventeen photograms regarding successive instants in time (proceeding from left to right), all the photograms illustrating schematically the same portion of space downstream of a nozzle;

FIGS. 9 and 10 are schematic top views with portions removed of variants of the present microfluidic device;

DETAILED DESCRIPTION

Figure 1:
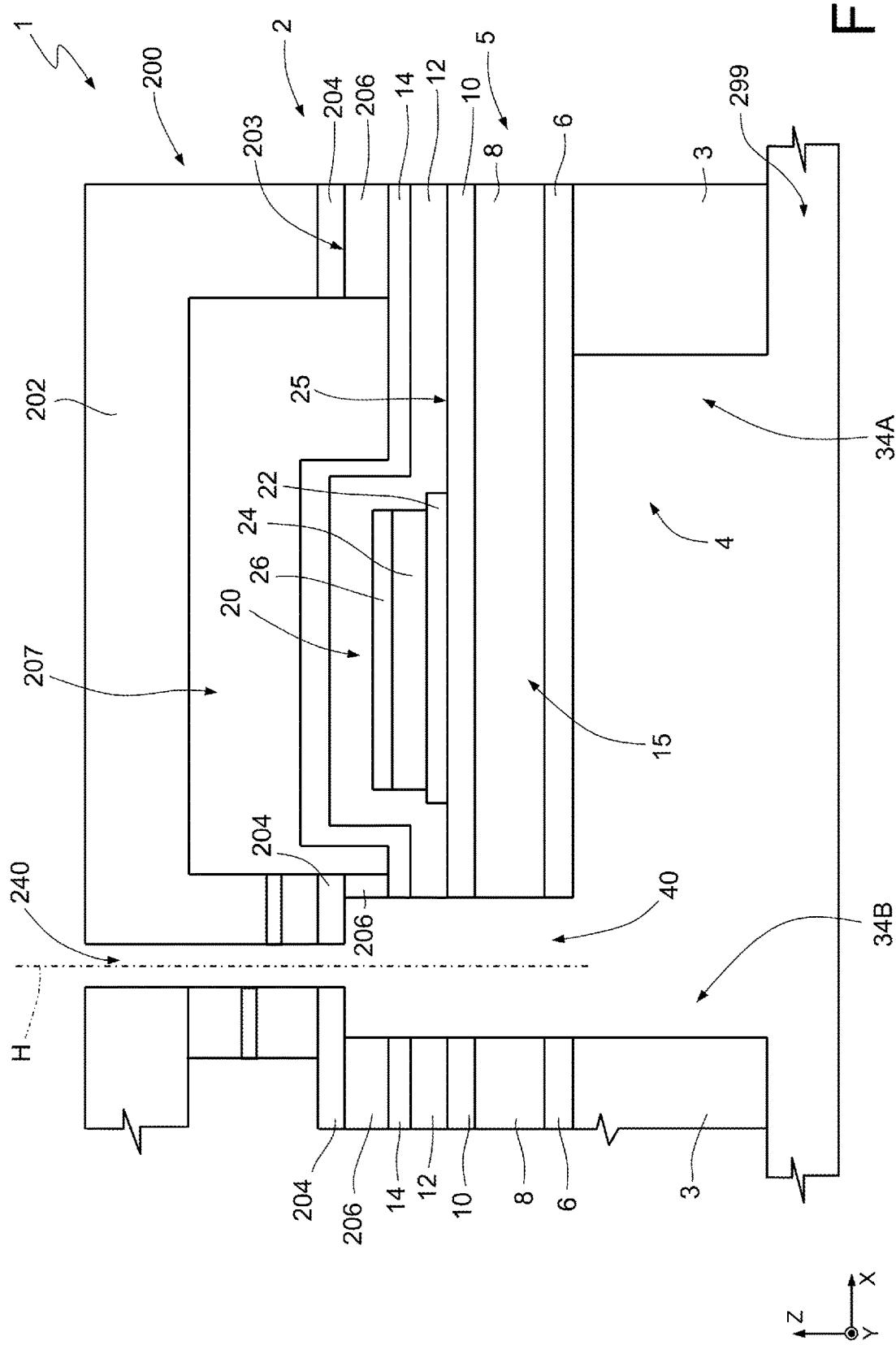
FIG. 1 is a schematic cross-sectional view (not in scale) of a portion of a cell of a microfluidic device for spraying liquids, taken along the line of section I-I shown in FIG. 2.

FIG. 1 is a cross-sectional view of a portion of a cell 2 of a microfluidic device 1 for spraying liquids, taken in a plane XZ of a cartesian reference system XYZ.

The cell 2 comprises a semiconductor body 3, for example, of silicon, inside which a chamber 4 is formed, described in greater detail hereinafter. For instance, the semiconductor body 3 has the shape of a parallelepiped with axis parallel to the axis Z and with side faces parallel, alternately, to the plane ZY or to the plane ZX.

The cell 2 further comprises an intermediate structure 5, which is in turn formed by a first dielectric layer 6, by a semiconductor layer 8, by a second dielectric layer 10 and by a first and a second protective layer 12, 14.

In detail, the first dielectric layer 6 is for example of silicon oxide and extends over the semiconductor body 3, in direct contact therewith.

The semiconductor layer 8 is for example of the same semiconductor material as the body 3 and extends over the first dielectric layer 6, in direct contact therewith.

The second dielectric layer 10 is for example of silicon oxide and extends over the semiconductor layer 8, in direct contact therewith.

The first protective layer 12 is for example of silicon oxide and extends over the second dielectric layer 10.

The second protective layer 14 is for example of silicon nitride extends over the first protective layer 12, in direct contact therewith.

Once again with reference to the chamber 4, it is laterally delimited by portions of the semiconductor body 3. Furthermore, the chamber 4 is delimited at the top by a part of the intermediate structure 5; in particular, the portions of the first dielectric layer 6, of the semiconductor layer 8 and of the second dielectric layer 10, that form said part of intermediate structure 5, form a membrane 15, which is suspended over the chamber 4. The chamber 4 is open at the bottom.

The cell 2 further comprises a first piezoelectric actuator 20, which includes a bottom electrode 22, of conductive material (for example, platinum or molybdenum) and is arranged on the second dielectric layer 10, and a first piezoelectric region 24, which is for example of PZT (Pb, Zr, TiO$_3$), AlN or an alkaline niobate such as the material known as KNN (K$_{0.5}$Na$_{0.5}$NbO$_3$) and is arranged on the bottom electrode 22, in direct contact therewith; the first piezoelectric actuator 20 further comprises a top electrode 26, which is of conductive material (for example, platinum, ruthenium, a titanium and tungsten alloy, or iridium oxide) and is arranged on the first piezoelectric region 24, in direct contact therewith. In addition, portions of the first and the second protective layers 12, 14 overlie and laterally surround the first piezoelectric actuator 20. The above portions of the first and the second protective layers 12, 14 form, together with the second dielectric layer 10, a package of the first piezoelectric actuator 20.

Purely by way of example, the chamber 4 has a uniform profile along the axis Z. Furthermore, the chamber 4 comprises a main portion 34A, a secondary portion 34B, and a connecting portion 34C.

To a first approximation, each one of the main portion 34A and the secondary portion 34B has the shape of a portion of a corresponding cylinder with axis parallel to the axis Z. In particular, to a first approximation, the secondary portion 34B has the shape of a semi-cylinder, while the primary portion 34A has a shape that can be obtained by intersecting a cylinder (which has a radius larger than that of the aforementioned semi-cylinder) with a plane parallel to the plane ZY and lying between the axis of the cylinder and the axis of the semi-cylinder. The axes of the semi-cylinder and of the cylinder lie to a first approximation in a plane parallel to the plane ZX, which, in what follows, will be referred to as the plane of symmetry SP.

The connecting portion 34C has, to a first approximation, the shape of a parallelepiped with axis parallel to the axis Z, interposed between the main portion 34A and the secondary portion 34B, and with a pair of side walls parallel to the plane ZX. To a first approximation, the chamber 4 is symmetrical with respect to the plane of symmetry SP.

Figure 2:
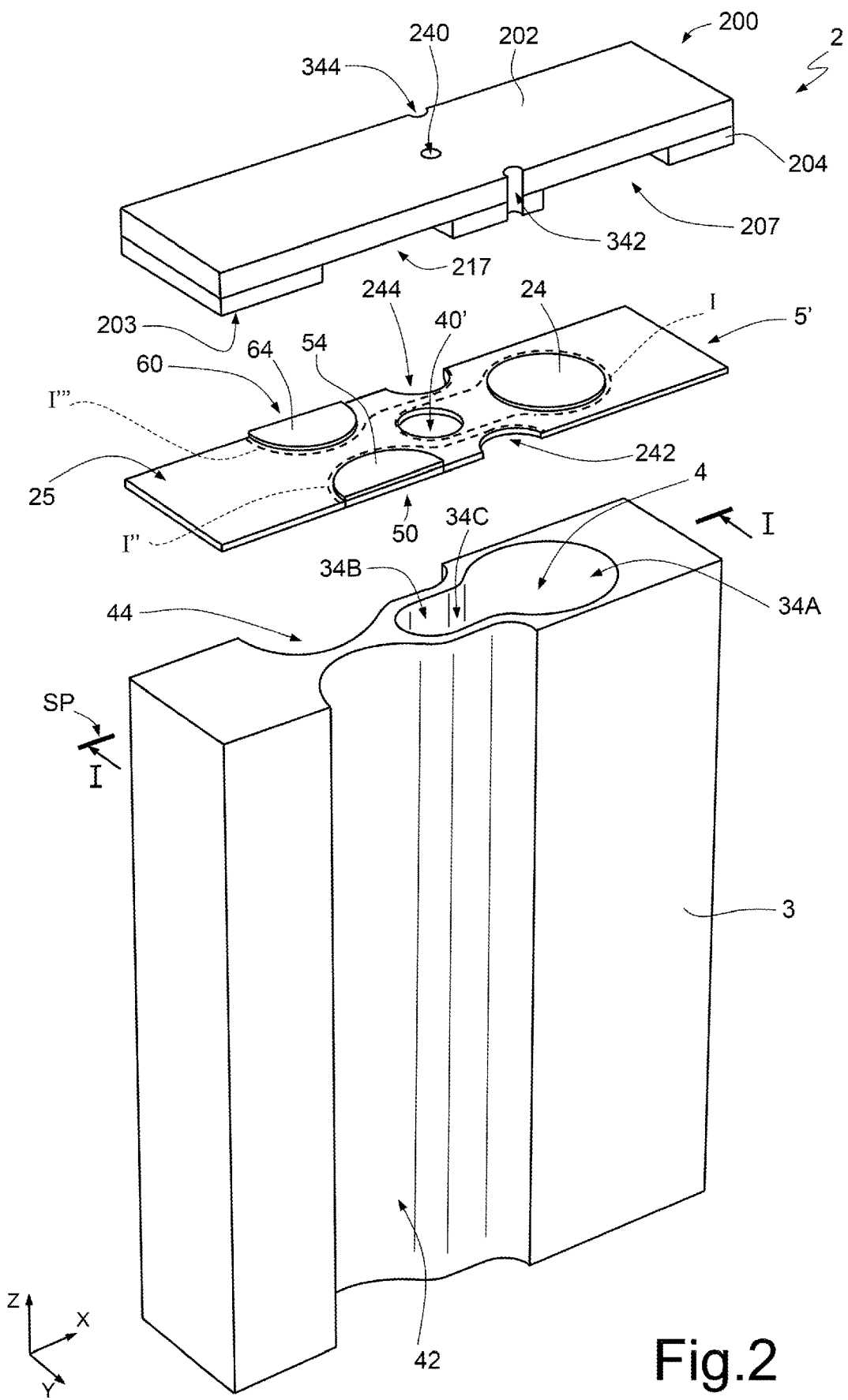
FIG. 2 is a schematic exploded perspective view of the cell illustrated in FIG. 1.

As may be seen once again in FIG. 2, the first piezoelectric region 24 has a planar shape in top view and, to a first approximation, a circular shape. In this regard, for greater clarity, in FIG. 2 the first and the second protective layers 12, 14 are not illustrated, nor is the bottom electrode 22 or the top electrode 26, consequently, the first piezoelectric region 24 appears as being arranged above a multilayer (designated by 5') formed by the first dielectric layer 6, the semiconductor layer 8, and the second dielectric layer 10. In other words, the first piezoelectric region 24 appears as being arranged on a surface 25 that delimits the multilayer 5' at the top, said surface 25 being formed by the second dielectric layer 10. In addition, to facilitate understanding, in FIG. 2 a closed imaginary line I is shown, defined as the projection on the surface 25 of the perimeter (in top view) of the underlying chamber 4.

In greater detail, to a first approximation, the first piezoelectric region 24 is aligned vertically, i.e., parallel to the axis Z, to the underlying cylindrical shape of the main portion 34A of the chamber 4. Moreover, as may be seen in the profile of the closed imaginary line I, in top view the first piezoelectric region 24 is entirely comprised within the main portion 34A of the chamber 4.

Once again with reference to the cell 2, extending through the intermediate structure 5 is a supply channel 40, which has, for example, a cylindrical shape, with axis that is parallel to the axis Z and lies, to a first approximation, in the plane of symmetry SP. Once again with reference to the plane of symmetry SP, this coincides with the plane of section referred to in FIG. 1, where, for simplicity, only a part of the cell 2 is shown.

The supply channel 40 thus extends through the first dielectric layer 6, the semiconductor layer 8, the second dielectric layer 10, and the first and the second protective layers 12, 14. Moreover, the supply channel 40 is laterally spaced apart with respect to the piezoelectric actuator 20.

As may be seen in FIG. 2, which shows the part (designated by 40') of the supply channel 40 that traverses the multilayer 5', to a first approximation the supply channel 40 is vertically aligned with the underlying secondary portion 34B of the chamber 4, in the sense that the axis of the supply channel 40 coincides, to a first approximation, with the axis of the semi-cylindrical shape of the secondary portion 34B.

In addition, once again by way of example, the radius of the supply channel 40 is, to a first approximation, equal to the radius of the semi-cylinder of the underlying secondary portion 34B of the chamber 4. Therefore, the supply channel 40 overlies both part of the secondary portion 34B of the chamber 4 and part of the connecting portion 34C of the chamber 4.

As may be seen in FIG. 2, present in the semiconductor body 3 are a first and a second bottom recess 42, 44.

To a first approximation, the first and the second bottom recesses 42, 44 have symmetrical shapes with respect to the plane of symmetry SP. Moreover, if we denote by basic shape the shape of any one of the two half-chambers that are obtained by sectioning the chamber 4 along the plane of symmetry SP, each one of the first and the second bottom recesses 42, 44 has, to a first approximation, a shape that is the same as the aforesaid basic shape.

Figure 3:
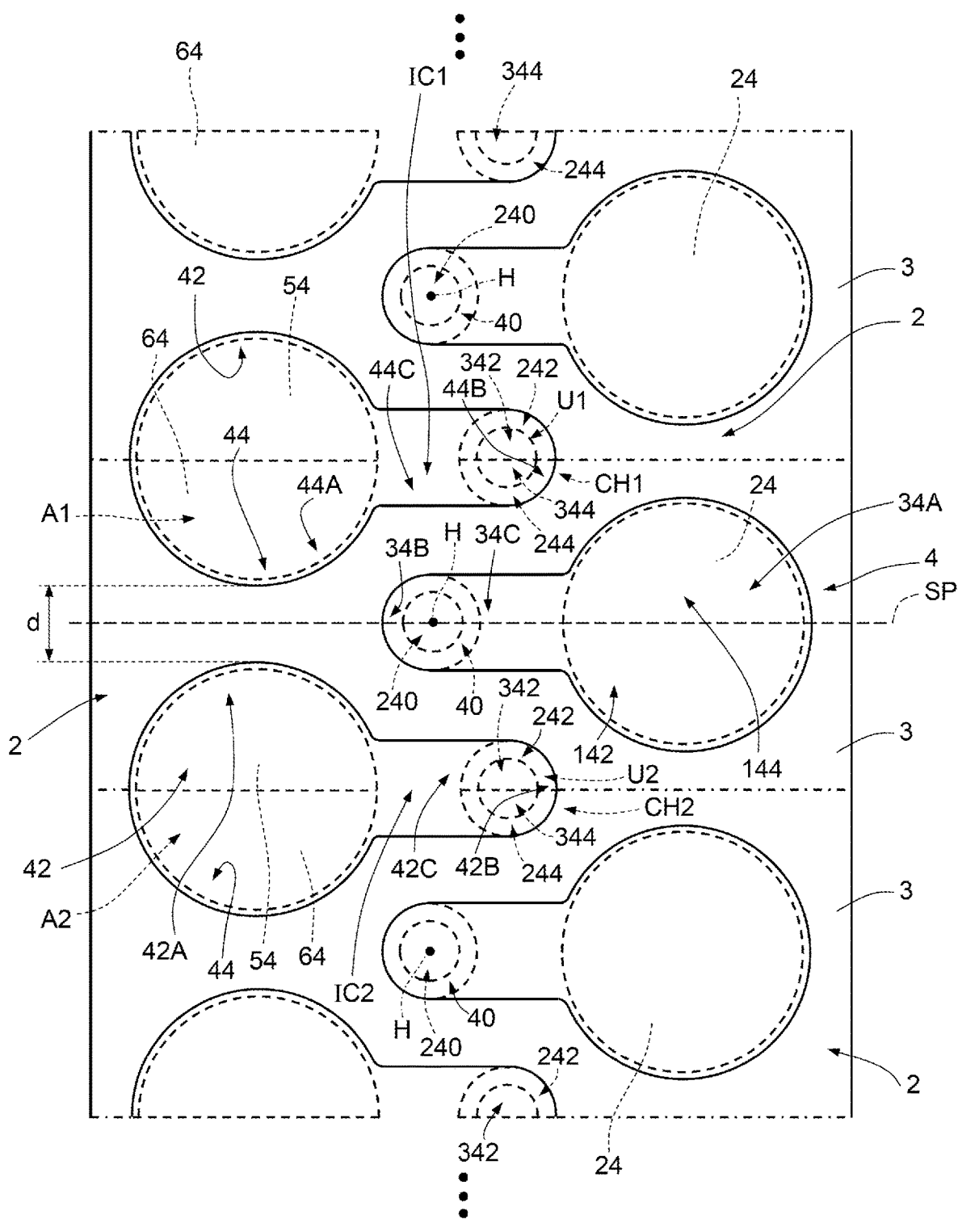
FIG. 3 is a schematic top view with parts removed of a portion of the microfluidic device.

In greater detail, if we denote by the first and the second half-chambers 142, 144 (visible in FIG. 3) the aforementioned half-chambers that are obtained by sectioning the chamber 4 along the plane of symmetry SP, the first bottom recess 42 and the first half-chamber 142 are arranged on a same side of the plane of symmetry SP; in addition, as may be seen in FIG. 3, ideally the first bottom recess 42 can be obtained by rototranslation of the first half-chamber 142, and in particular by rotation through 180° in a clockwise direction (in top view) and subsequent translation parallel to the plane XY.

Likewise, the second bottom recess 44 and the second half-chamber 144 are arranged on the other side of the plane of symmetry SP; in addition, the second bottom recess 44 can be obtained by rototranslation of the second half-chamber 144, and in particular by rotation through 180° in a counterclockwise direction (in top view) and subsequent translation parallel to the plane XY.

In particular, in a direction parallel to the axis X, the first and the second bottom recesses 42, 44 are positioned laterally with respect to the chamber 4 so that the secondary portion 34B and at least part of the connecting portion 34C of the chamber 4 extend in the portion of space laterally delimited by the first and the second bottom recesses 42, 44.

In addition, the first and the second bottom recesses 42, 44 are spaced apart, in a direction parallel to the axis Y, by a distance (denoted by d in FIG. 3), which is smaller than the diameter of the secondary portion 34B of the chamber 4. In other words, in a side view (and with a point of view opposite with respect to the axis X), the secondary portion 34B of the chamber 4 partially overlies, at a distance, the first and the second bottom recesses 42, 44.

As may be seen once again in FIG. 2, the cell 2 also includes a second and a third piezoelectric actuator 50, 60, which comprise, respectively, a second piezoelectric region 54 and a third piezoelectric region 64, for example, of the same material as the first piezoelectric region 24. Even though not illustrated, also the second and the third piezoelectric actuators 50, 60 comprise respective bottom and top electrodes; moreover, also the second and the third piezoelectric actuators 50, 60 are surrounded by respective packages formed by the first and the second protective layers 12, 14.

To a first approximation, the second and the third piezoelectric regions 54, 64 are symmetrical with respect to the plane of symmetry SP and are laterally spaced apart, in a direction parallel to the axis X, with respect to the first piezoelectric region 24. Moreover, to a first approximation, the second and the third piezoelectric regions 54, 64 have planar shapes; in top view, the second and the third piezoelectric regions 54, 64 have the shape of semi-circles delimited by corresponding diameters parallel to the axis X, so that the curvilinear portion of the corresponding semi-circumference has a concavity facing the plane of symmetry SP.

To a first approximation, the second and the third piezoelectric regions 54, 64 overlie respectively, at a distance, the first and the second bottom recesses 42, 44.

In even greater detail, if we denote by main portion 42A, secondary portion 42B, and connecting portion 42C (FIG. 3) of the first bottom recess 42, the parts of the first bottom recess 42 that are, respectively, equal, to a first approximation, to half of the main portion 34A, half of the secondary portion 34B, and half of the connecting portion 34C of the chamber 4, and by main portion 44A, secondary portion 44B, and connecting portion 44C of the second bottom recess 44 the parts of the second bottom recess 44 that are, respectively, equal, to a first approximation, to half of the main portion 34A, half of the secondary portion 34B, and half of the connecting portion 34C of the chamber 4, the second and the third piezoelectric regions 54, 64 overlie at a distance, respectively, the main portion 42A of the first bottom recess 42 and the main portion 44A of the second bottom recess 44. In this regard, to facilitate understanding, illustrated in FIG. 2 are two open imaginary lines I'', I''', which represent the projections on the surface 25 of the edges, in top view, of the first and the second bottom recesses 42, 44; moreover, FIG. 3 shows dashed the volumes occupied by the first, second and third piezoelectric regions 24, 54, 64.

Once again with reference to the cell 2, the intermediate structure 5 has a first and a second intermediate recess 242, 244, each of which has the shape of a semi-cylinder, with axis parallel to the axis Z and concavity facing the plane of symmetry SP, that passes right through the intermediate structure 5, even though, for simplicity of representation, in FIG. 2 it is shown as passing through just the multilayer 5'. Moreover, the first and the second intermediate recesses 242, 244 are symmetrical with respect to the plane of symmetry SP, have shapes approximately equal to half of the supply channel 40 and communicate with underlying portions of the first and the second bottom recesses 42, 44, respectively.

In greater detail, to a first approximation, the first and the second intermediate recesses 242, 244 have axes coinciding, respectively, with the axes of the underlying semi-cylindrical shapes of the secondary portions 42B, 44B of the first and the second bottom recesses 42, 44. Once again to a first approximation, the radius of the first and the second intermediate recesses 242, 244 is equal to the radius of the semi-cylindrical shape of the secondary portions 42B, 44B of the first and the second bottom recesses 42, 44.

The cell 2 further comprises a top structure 200, which includes a top semiconductor region 202, which is for example of the same semiconductor material that forms the semiconductor body 3, and an underlying top dielectric region 204, which is for example of silicon oxide and is arranged in contact with the top semiconductor structure 202.

In greater detail, the top dielectric region 204 is delimited at the bottom by a bottom surface 203 and is fixed to the intermediate structure 5 by a gluing layer 206 (illustrated only in FIG. 1), which is interposed between the top dielectric region 204 and the second protective layer 14. The supply channel 40 also extends through the gluing layer 206, with an approximately uniform section in a direction parallel to the axis Z.

Figure 4:
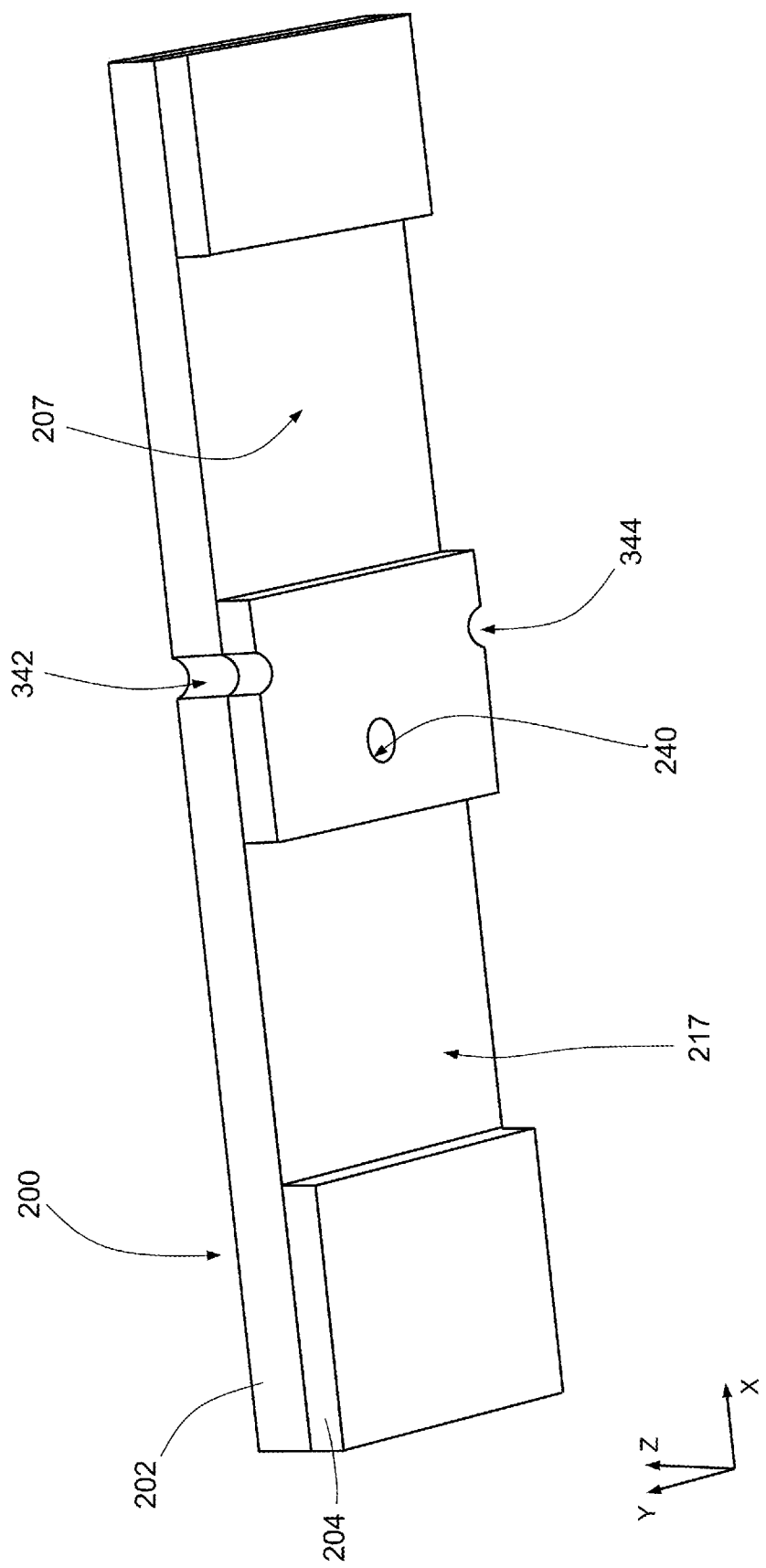
FIG. 4 is a schematic perspective view from beneath of a portion of the cell illustrated in FIG. 2.

As may be seen in FIG. 4, the top structure 200 further comprises a first and a second cavity 207, 217, which extend upwards, starting from the bottom surface 203, passing through the top dielectric region 204 and part of the top semiconductor region 202. The first and the second cavities 207, 217 are spaced apart in a direction parallel to the axis X and are, for example, parallelepipedal and are delimited laterally along the axis X.

In addition, the first cavity 207 overlies the first piezoelectric actuator 20; in this way, the portions of the first and the second protective layers 12, 14 that overlie the first piezoelectric actuator 20 can extend at least in part within the cavity 207, at a distance from the top semiconductor region 202 and from the top dielectric region 204.

The second cavity 217 overlies the second and the third piezoelectric actuators 50, 60; in this way, portions of the first and the second protective layers 12, 14 that overlie the second and the third piezoelectric actuators 50, 60 can extend at least in part within the second cavity 217, at a distance from the top semiconductor region 202.

The first and the second cavities 207, 217 are furthermore laterally spaced apart with respect to the underlying supply channel 40.

In addition, the top structure 200 has a nozzle 240, which has, for example, a cylindrical shape and extends through the top semiconductor region 202 and the top dielectric region 204, between the first and the second cavities 207, 217.

To a first approximation, the nozzle 240 has a cylindrical shape and is vertically aligned with the supply channel 40, which has a diameter larger than the diameter of the nozzle 240; In this regard, FIG. 3 shows dashed the volumes occupied by the supply channel 40 and by the nozzle 240. Moreover, the nozzle 240 and the underlying supply channel 40 are communicating. To a first approximation, the axis of the supply channel 40 (designated by H) lies in the plane of symmetry SP.

The top structure 203 furthermore delimits a pair of further recesses, which, in what follows, will be referred to as the first and the second top recesses 342, 344.

The first and the second top recesses 342, 344 are arranged between the first and the second cavities 207, 217 and traverse the top semiconductor region 202 and the top dielectric region 204. For instance, the first and the second top recesses 342, 344 have semi-cylindrical shapes with axes parallel to the axis Z and the concavity facing the plane of symmetry SP.

In greater detail, the first and the second top recesses 342, 344 are symmetrical with respect to the plane of symmetry SP. Moreover, to a first approximation, the axes of the semi-cylindrical shapes of the first and the second top recesses 342, 344 coincide, respectively, with the axes of the semi-cylindrical shapes of the underlying first and second intermediate recesses 242, 244, as may be seen in FIG. 3, which shows dashed the volumes occupied by the first and the second intermediate recesses 242, 244 and by the first and the second top recesses 342, 344. The radiuses of the first and the second top recesses 342, 344 are smaller than the radiuses of the first and the second intermediate recesses 242, 244.

Figure 5:
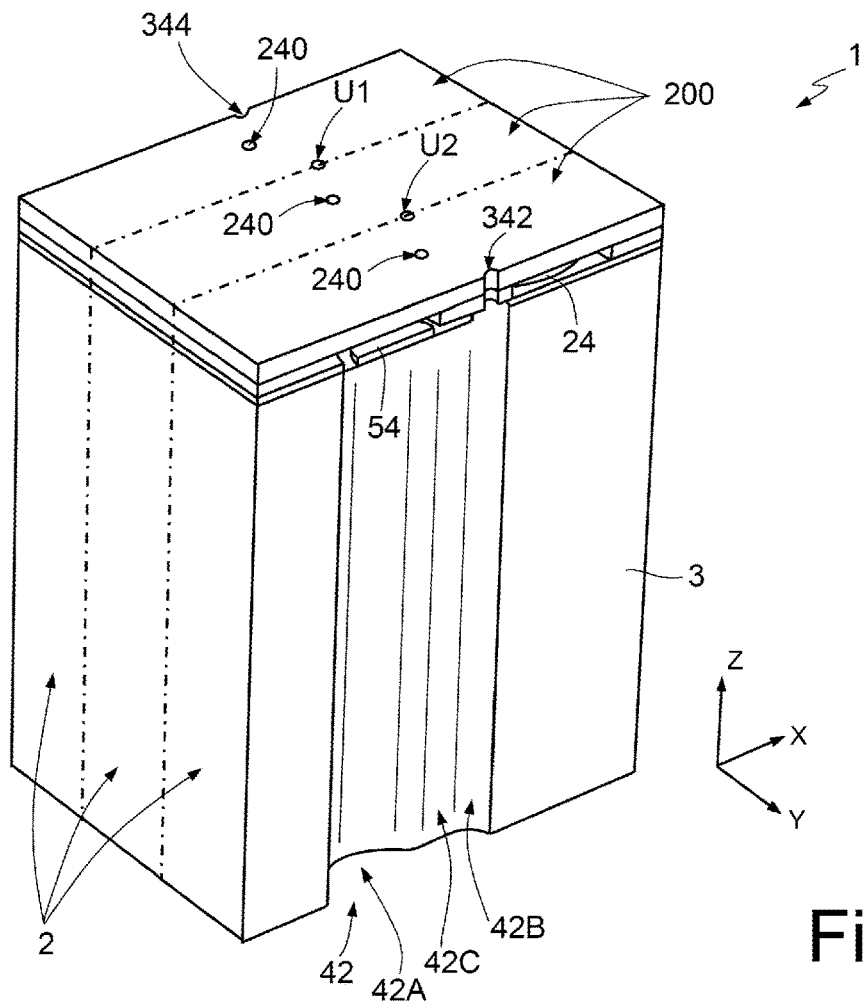
FIG. 5 is a schematic perspective top view of a part of the microfluidic device.

As shown in FIG. 3 and in FIG. 5, the microfluidic device 1 comprises a plurality of cells 2 (three of which are illustrated in FIGS. 3 and 5), which are juxtaposed in a direction parallel to the axis Y.

In greater detail, even though in FIGS. 3 and 5, for greater clarity, dashed and dotted lines are present that highlight the outlines of the cells 2, the latter share the semiconductor body 3, the intermediate structure 5, and the top structure 200, and therefore also the first and the second cavities 207, 217.

In particular, the cells 2 are arranged laterally so that the second bottom recess 44 of a cell 2 faces the first bottom recess 42 of a first adjacent cell, delimiting a first intercell chamber IC1, which, to a first approximation, has the same shape as the chamber 4; in addition, the first bottom recess 42 of a cell 2 faces the second bottom recess 44 of a second adjacent cell, delimiting a second intercell chamber IC2, which, to a first approximation, has the same shape as the chamber 4 and is symmetrical with respect to the first intercell chamber IC1.

Moreover, the third piezoelectric region 64 of a cell 2 contacts the second piezoelectric region 54 of a first adjacent cell, to form a single piezoelectric region having substantially the same shape as the first piezoelectric region 24; likewise, the bottom electrodes (not illustrated) that underlie, respectively, the aforementioned third piezoelectric region 64 and the second piezoelectric region 54 contact one another, as likewise the top electrodes (not illustrated) that overlie, respectively, the aforementioned third piezoelectric region 64 and second piezoelectric region 54. In other words, the third piezoelectric actuator 60 of the cell 2 forms, with the second piezoelectric actuator 50 of the first adjacent cell, a first intercell piezoelectric actuator A1, which has approximately the same shape as the first piezoelectric actuator 20 and is operatively coupled to the first intercell chamber IC1, as described in greater detail hereinafter.

Likewise, the second piezoelectric region 54 of a cell 2 contacts the third piezoelectric region 64 of a second adjacent cell, to form a single piezoelectric region having substantially the same shape as the first piezoelectric region 24. Likewise, the bottom electrodes (not illustrated) that underlie, respectively, the aforementioned second piezoelectric region 54 and third piezoelectric region 64 contact one another, as likewise the top electrodes (not illustrated) that overlie, respectively, the aforementioned second piezoelectric region 54 and third piezoelectric region 64. In other words, the second piezoelectric actuator 50 of the cell 2 forms, with the third piezoelectric actuator 60 of the second adjacent cell, a second intercell piezoelectric actuator A2, which has approximately the same shape as the first piezoelectric actuator 20 and is operatively coupled to the second intercell chamber IC2, as described in greater detail hereinafter.

In addition, the second intermediate recess 244 of the cell 2 faces the first intermediate recess 242 of the first adjacent cell, delimiting a first intercell supply channel CH1, which, to a first approximation, has the same shape as the supply channel 40; furthermore, the first intermediate recess 242 of the cell 2 faces the second bottom recess 244 of the second adjacent cell, delimiting a second intercell supply channel CH2, which, to a first approximation, has the same shape as the supply channel 40 and is symmetrical with respect to the first intercell supply channel CH1.

Moreover, the second top recess 344 of the cell 2 faces the first top recess 342 of the first adjacent cell, delimiting a first intercell nozzle U1, which, to a first approximation, has the same shape as the nozzle 240; likewise, the first top recess 342 of the cell 2 faces the second top recess 344 of the second adjacent cell, delimiting a second intercell nozzle U2, which, to a first approximation, has the same shape as the nozzle 240 and is symmetrical with respect to the first intercell nozzle U1. The first and the second nozzles U1, U2 are arranged along a same direction parallel to the axis Y, while the nozzle 240 is laterally spaced apart with respect to said direction.

In other words, if we denote by intracell injection unit the ensemble formed by the chamber 4, the supply channel 40, the nozzle 240, the first piezoelectric actuator 20, and the membrane 15, between pairs of adjacent cells an intercell injection unit is present that is the same as the intracell injection unit; i.e., it has, to a first approximation, the same relative arrangement between the chamber, the supply channel, the nozzle, piezoelectric actuator and the membrane. This enables compacting of the arrangement of the nozzles of the microfluidic device 1.

In what follows, operation of the microfluidic device 1 is described with reference just to the intracell injection unit, except where specified otherwise; operation of the intercell injection units is the same as that of the intracell injection unit.

As may be seen in FIG. 1, the bottom portion of the chamber 4 is fluidically coupled to a basin 299, which is shared between the cells 2, and therefore between the chambers 4 and the intercell chambers IC1, IC2. In particular, the coupling of the bottom portion of the chamber 4 to the basin 299 occurs without introducing any hydraulic resistance, i.e., without any pressure drop between the bottom portion of the chamber 4 and the basin 299, because as said before, the chamber 4 is open at bottom, so as to directly communicate with the basin 299. Similar considerations apply to the hydraulic coupling between the intercell chambers IC1, IC2 and the basin 299. From an hydraulic point of view, the chamber 4 and the intercell chambers IC1, IC2 are directly connected to the basin 299.

In a per se known manner, the basin 299 forms part of a hydraulic system (not illustrated), which supplies the basin 299 with a liquid (ink) at a relatively high pressure. In this way, the liquid fills the chamber 4 and the supply channel 40, which has a hydraulic resistance higher than that of the chamber 4, but in any case, negligible with respect to that of the nozzle 240. For instance, the ratio between the hydraulic resistance of the nozzle 240 and the hydraulic resistance of the supply channel 40 is higher than 1.5.

Figure 6:
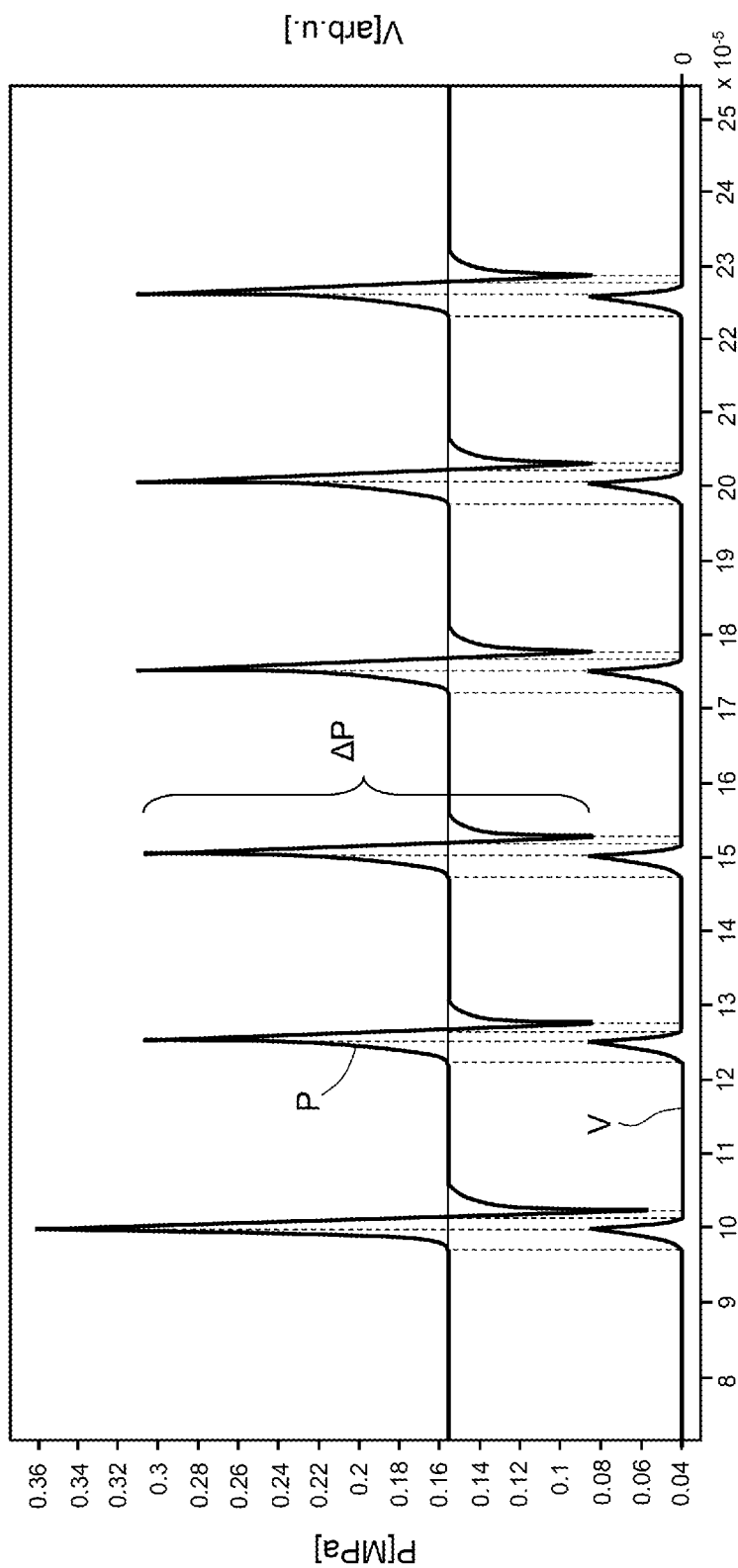
FIG. 6 shows examples of time plots of a voltage applied to the present microfluidic device and of a pressure within the present microfluidic device.

In greater detail, assuming that the cell 2 is orientated so as to eject the liquid along the direction of the force of gravity (and therefore that the axis Z is orientated along the direction of the force of gravity), between the bottom electrode 22 and the top electrode 26 of the first piezoelectric actuator 20 a voltage $V=V_0+v(t)$ can be applied, where $V_0$ is a constant and v(t) is variable in time, so that the pressure in the chamber 4 has an evolution of the type represented in FIG. 6. In what follows, $V_0$ is assumed to be zero, for simplicity.

In detail, the pressure in the chamber 4 is equal to $P=P_0+p(t)$, where $P_0$ is equal to the pressure in the basin 299 (for example, equal to 0.16 MPa); p(t) is variable in time and has an evolution that depends upon the voltage v(t), which is assumed as being pulsed and unipolar, so that the pressure p(t) exhibits a bipolar pulse for each pulse of the voltage v(t).

Hereinafter, it is assumed that in a resting position, i.e., in the absence of driving of the first piezoelectric actuator 20, the membrane 15 is in the position illustrated in FIG. 1. This having been said, each pulse of the voltage v(t) causes a corresponding driving of the first piezoelectric actuator 20, which causes a deformation of the membrane 15; instead, the supply channel 40 and the nozzle 240 maintain their respective shapes unaltered. In particular, the portion of the intermediate structure 5 that laterally delimits the supply channel 40 does not undergo deformation following upon the action of the first piezoelectric actuator 20, unlike the portion of the intermediate structure 5 that forms the membrane 15. In practice, the top structure 200 forms a sort of nozzle body, which, being fixed to the portion of the intermediate structure 5, that laterally delimits the supply channel 40, contributes to providing rigidity for said portion of the intermediate structure 5.

In detail, to each pulse of the voltage v(t), the membrane 15 curves, to a first approximation, with a convexity facing the chamber 4, reducing the volume of the latter and causing a corresponding increase in the pressure in the chamber 4, which presents as an initial ascending portion of the corresponding pulse of the pressure p(t). At the end of the pulse of the voltage v(t), the first piezoelectric actuator 20 is turned off; this leads to release of the membrane 15 and a consequent elastic return of the latter, which, before returning into the resting position, curves, to a first approximation, with a convexity facing the first cavity 207, thus increasing the volume of the chamber 4 and therefore causing a corresponding reduction of the pressure in the chamber 4, which presents as a descending portion of the corresponding pulse of the pressure p(t), this portion being subsequent to the aforementioned ascending portion. In particular, if $P_{max}$ and $P_{min}$ are, respectively, the maximum and minimum values of the pressure P during a pulse of the pressure p(t), we obtain $P_{max}-P_{min}=\Delta P$, with $\Delta P$, for example, equal to 0.3 MPa.

In even greater detail, the cell 2 is such that, when $P=P_0$, from the nozzle 240 a steady stream of liquid is ejected at a rate higher than a threshold (for example, 10 m/s). Consequently, the pressure $P_0$ is such as to exceed atmospheric pressure and the hydraulic resistance of the nozzle 240 and the supply channel 40 and guarantee that the stream will exceed the aforementioned rate threshold so as to render the stream, once it has exited from the nozzle 240, less sensitive to possible external disturbances, such as displacements of masses of air that might alter the trajectory thereof.

In addition, the first piezoelectric actuator 20 is driven so as to perturb, in an electronically controllable way, the stream of the liquid exiting the nozzle 240.

In particular, if we denote by initial conditions of the stream the conditions of pressure and speed that arise at outlet from the nozzle 240 when the pressure P is equal to $P_0$, the following obtains. Whenever a pulse of the voltage v(t) is generated, with a consequent pulse of the pressure p(t), the stream at outlet from the nozzle 240 undergoes an initial acceleration, due to the temporary increase in pressure with respect to the initial conditions, and a subsequent deceleration, due to a subsequent reduction of the pressure with respect to the initial conditions. These variations in speed cause an interruption of the flow. In particular, as illustrated in FIG. 7, the sequence of acceleration and deceleration causes formation of an enlarged portion 800 that follows a first continuous portion of liquid 801 and is followed, at a distance, by a subsequent second continuous portion of liquid 802. In practice, the enlarged portion 800 is a portion of liquid that, at outlet from the nozzle 240 and in a direction perpendicular to the direction of ejection (for example, coinciding with the direction of the force of gravity) from the nozzle 240, has a section having an area larger than the area of the first continuous portion of liquid 801. In order to prevent penetration of air into the nozzle 240, it is possible to impose that the pressure $P_{min}$ is higher than atmospheric pressure.

In greater detail, FIG. 8 shows, from left to right, how initially (first three photograms on the left) the first continuous portion of liquid 801 exits from the nozzle 240. As may be seen in the fourth photogram, following upon occurrence, between the third and the fourth photograms, of a first pulse of the voltage v(t), the enlarged portion 800 exits from the nozzle 240, followed, at a distance, by the second continuous portion of liquid 802. Moreover, as may be seen from the fourth photogram to the ninth photogram, as the first continuous portion of liquid 801 and the enlarged portion 800 proceed towards the printing medium (not visible in FIG. 8), they tend to form a spherical shape (i.e., to form a first drop, designated by 803 in the eighth and ninth photograms) so as to minimise the surface tension. The amount of liquid contained in the first drop 803 depends upon how much time has elapsed between the first pulse of the voltage v(t) and the immediately preceding pulse (not visible in FIG. 8); in what follows, it is assumed that a time T1 has elapsed.

Between the fourth and fifth photograms a second pulse of the voltage v(t) is present, so that, at the end of the second continuous portion of liquid 802, a corresponding enlarged portion 804 is created, followed at a distance by a third continuous portion of liquid 805. As may be seen from the fifth photogram to the eleventh photogram, as the second continuous portion of liquid 802 and the respective enlarged portion 804 proceed towards the printing medium, they tend to form a corresponding spherical shape (i.e., to form a second drop, designated by 805 in the photograms from the seventh one to the eleventh one). The amount of liquid contained in the second drop 805 depends upon how much time has elapsed between the first and the second pulses of the voltage v(t); in what follows, it is assumed that a time T2<T1 has elapsed. Consequently, the second drop 805 has a volume and a mass smaller than that of the first drop 805.

As may be seen once again in FIG. 8, purely by way of example it is assumed that, following the second pulse of the voltage v(t), subsequent pulses are generated that are spaced at a distance in time from the preceding ones by T2-T1 so as to cause generation of a further four drops (designated, respectively, by 806, 807, 808, 809) approximately equal to the second drop 805, before a subsequent interruption of the pulses occurs.

In practice, FIG. 8 shows how it is possible to modulate the size of the drops by varying the period of time that elapses between one pulse of the voltage v(t) and the next.

In a per se known manner, it is thus possible to route each of the aforementioned drops in a different way, according to the size of the drops themselves.

In other words, the first drop 803 can be routed in a way different from the second drop 805, which can be routed in the same way as the four drops 806-809.

For instance, limiting attention to the first and to the second drops 803, 805, the second drop 805 can be directed towards a recirculation system (not illustrated) adapted to direct the liquid once again into the basin 299, whereas the first drop 803 can be directed towards a medium to be printed 1000, illustrated in FIG. 7.

Routing can be carried out in a per se known manner by a selective-routing system 999 (illustrated in FIG. 7), such as, for example, a selective-routing system 999 that can be controlled so as to activate, if need be, a flow of air orthogonal to the direction of ejection of the drops, or an electrostatic deflection system.

As mentioned previously, what has been described with reference to the chamber 4, the first piezoelectric actuator 20, the supply channel 40, and the nozzle 240 applies also to the first intercell chamber IC1, the first intercell piezoelectric actuator A1, the first intercell supply channel CH1, and the first intercell nozzle U1, as likewise to the second intercell chamber IC2, the second intercell piezoelectric actuator A2, the second intercell supply channel CH2, and the second intercell nozzle U2. Moreover, the first piezoelectric actuator 20 and the first and the second intercell piezoelectric actuators A1, A2 can be driven independently of one another.

Moreover variants are possible, as illustrated, for example, in FIG. 9, where each cell, designated by 902, comprises a pair of piezoelectric actuators (of which only the corresponding piezoelectric regions are illustrated, both designated by 924), which are operatively coupled to the chamber (designated by 904), and therefore also to the supply channel (not visible in FIG. 9) and to the nozzle (illustrated dashed and designated by 940). In each cell 902, the second and the third piezoelectric actuators 50, 60 are absent. Moreover, the cell 902 is without the first and the second bottom recesses 42, 44, the first and the second intermediate recesses 242, 244, and the first and the second top recesses 342, 344. Without this implying any loss of generality, the arrangement of the cells 902 does not give rise to any intercell chamber or to any intercell supply channel or to any intercell nozzle.

In greater detail, the two piezoelectric actuators 920 overlie corresponding portions of the intermediate structure 5 (not visible in FIG. 9), which form corresponding membrane portions and are governed synchronously, for example, with a same electrical signal.

As illustrated in FIG. 10, likewise embodiments are possible in which each cell, designated by 1002, comprises a pair of chambers (designated, respectively, by 1004 and 1004'), each of which is operatively coupled to a corresponding piezoelectric actuator (of which only the corresponding piezoelectric regions are illustrated, designated by 1024 and 1024', respectively), a corresponding supply channel (not visible in FIG. 10), and a corresponding nozzle (represented dashed and designated by 1240 and 1240', respectively).

Figure 11:
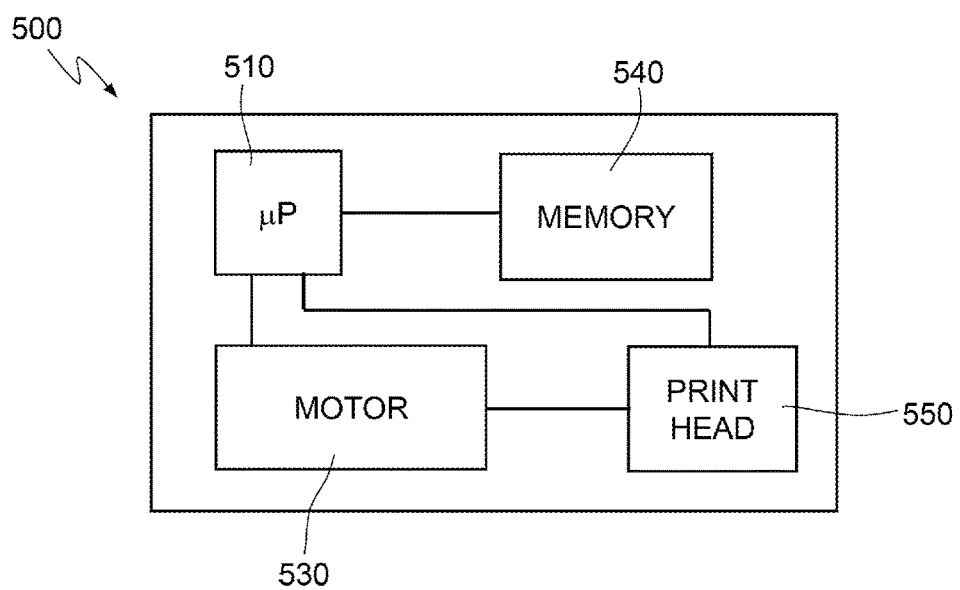
FIG. 11 shows a block diagram of a printer comprising the present microfluidic device.

For practical purposes, the microfluidic device 1 can be incorporated in any printer, as illustrated, for example, in FIG. 11.

In detail, FIG. 11 shows a printer 500 comprising a microprocessor 510, a memory 540 coupled in communication to the microprocessor 510, a printhead 550, and a motor 530, configured to drive the printhead 550. The printhead 550 may be formed by one or more microfluidic devices 1. The microprocessor 510 is coupled to the printhead 550 and to the motor 530 and is configured to coordinate movement of the printhead 550 (driven by the motor 530) and to cause ejection of drops of liquid (for example, ink) by the printhead 550, controlling the piezoelectric actuators of the cells 2 of the microfluidic devices 1.

The microfluidic device 1 can be manufactured by the process described in what follows, with reference to the details regarding fabrication of a single cell 2, except where specified otherwise.

Figure 12:
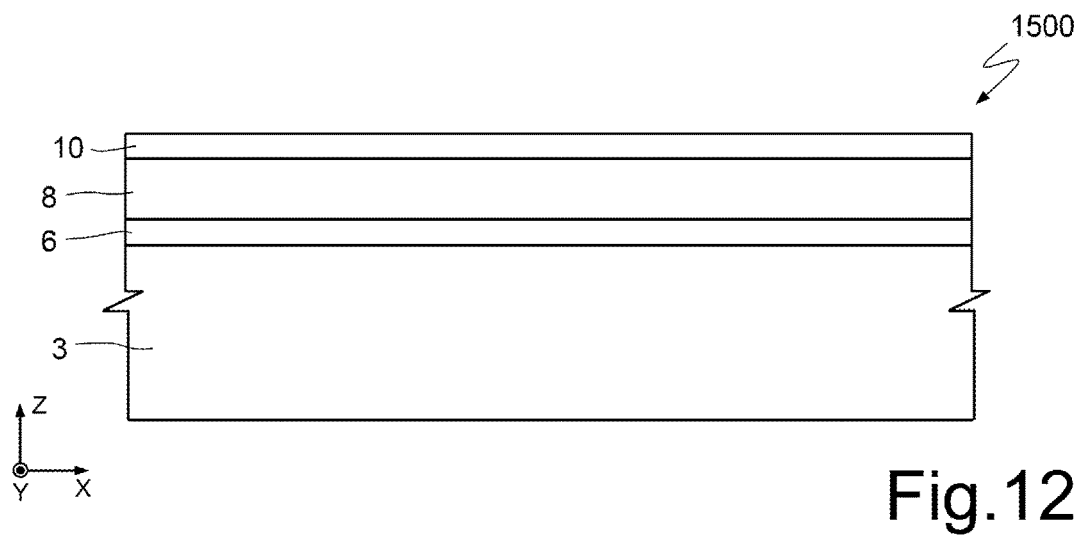
FIGS. 12 to 14 are schematic cross-sectional views of a portion of a first wafer, in successive manufacturing steps.

Initially, as illustrated in FIG. 12, a first semiconductor wafer 1500 is arranged, which comprises a semiconductor substrate that forms the semiconductor body 3, on which the first dielectric layer 6, the semiconductor layer 8, and the second dielectric layer 10 are arranged in succession. For simplicity, FIG. 12 and the subsequent FIGS. 13 and 14 refer to the same portion of microfluidic device 1 illustrated in FIG. 1.

Figure 13:
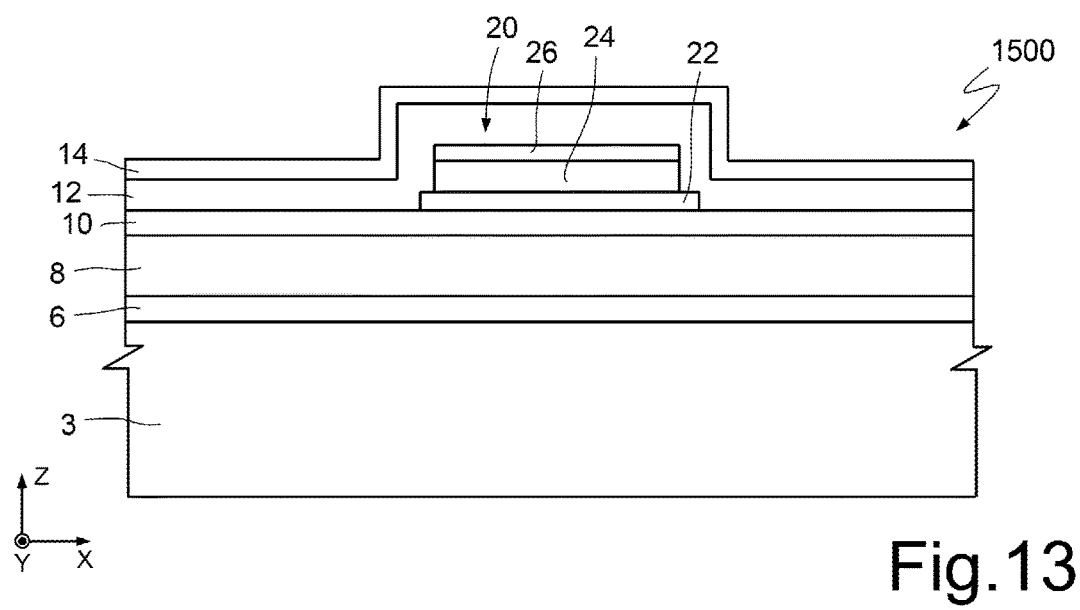

Next, as shown in FIG. 13, in a per se known manner the first piezoelectric actuator 20 and the first and the second intercell piezoelectric actuators A1, A2 are formed (the latter two actuators not being visible in FIG. 12), as well as the first and the second protective wafer layers 12, 14, which coat the first piezoelectric actuator 20 and the first and the second intercell piezoelectric actuators A1, A2.

Figure 14:
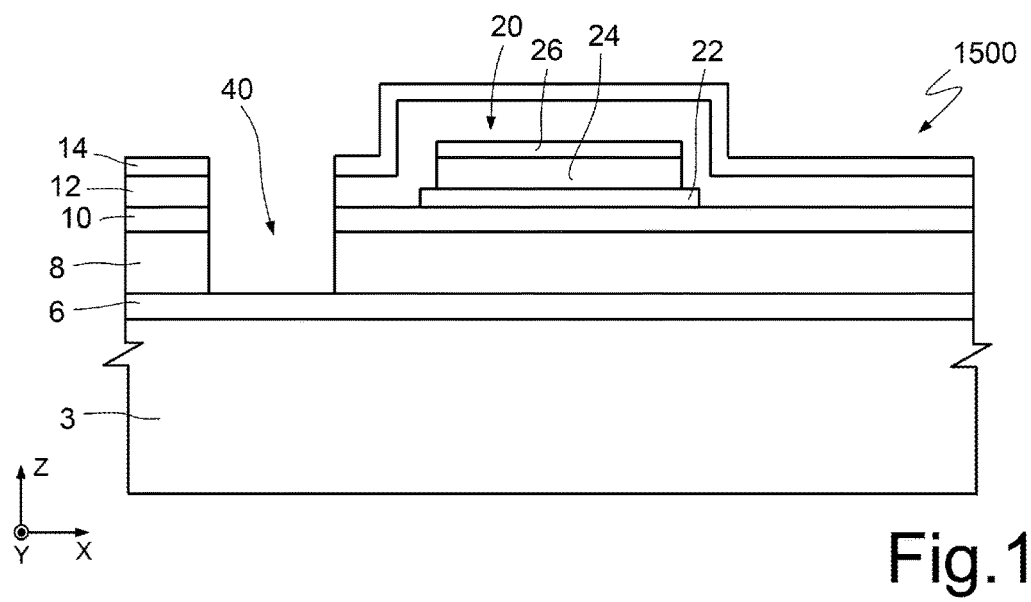

Next, as illustrated in FIG. 14, a plasma etch of a dry type is carried out so as to enable selective removal of portions of the first and the second protective layers 12, 14, the first and the second dielectric layers 6, 10, and the semiconductor layer 8, in such a way as to form the supply channel 40 (in particular, a front part of the supply channel 40, which extends through the first and the second protective layers 12, 14, the second dielectric layer 10, and the semiconductor layer 8) and the first and the second intercell supply channels CH1, CH2 (the latter two channels not being visible in FIG. 14).

Figure 15:
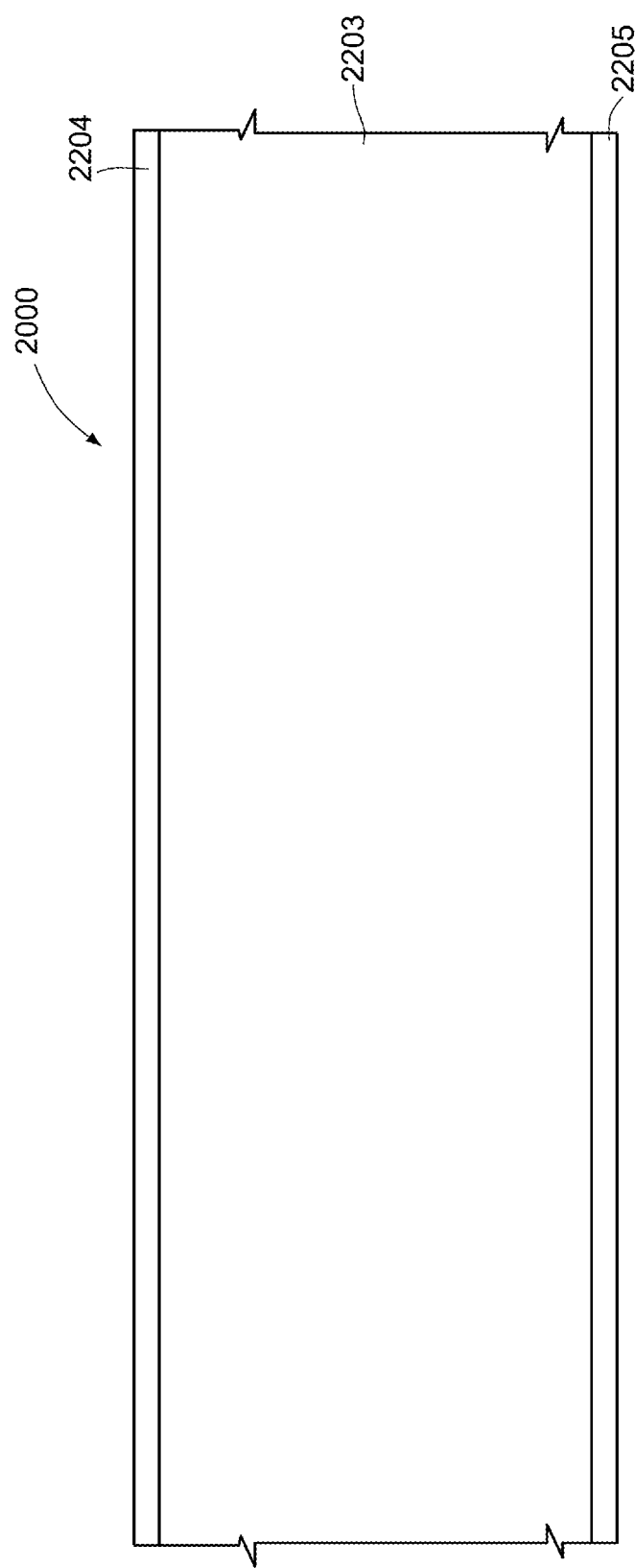
FIGS. 15 to 16 are schematic cross-sectional views of a portion of a second wafer, in successive manufacturing steps.

Next, as illustrated in FIG. 15, a second semiconductor wafer 2000 is arranged, which comprises a respective semiconductor substrate 2203, the main surfaces of which are coated, respectively, by a top dielectric coating layer 2204 and a bottom dielectric coating layer 2205, for example, of oxide.

Figure 16:
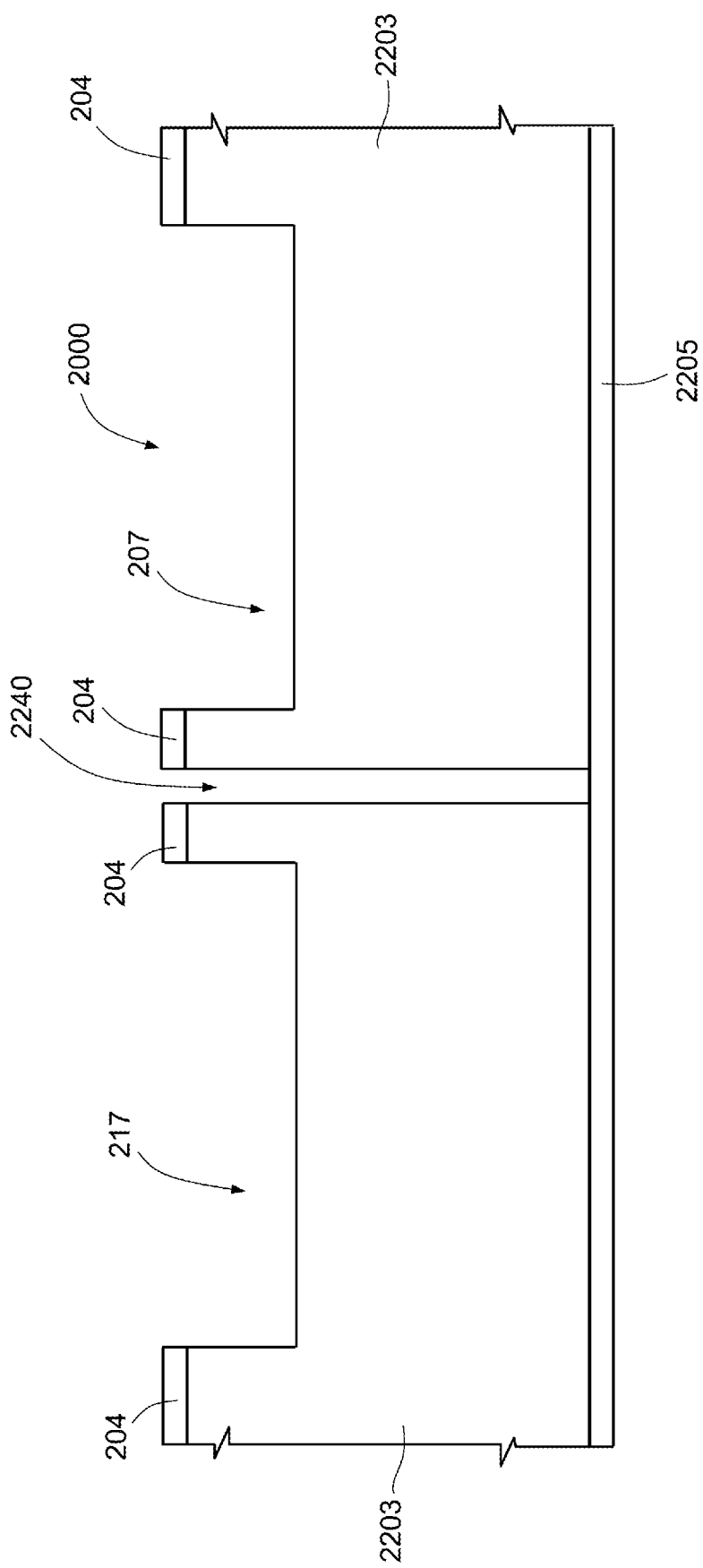

Next, as illustrated in FIG. 16, three different etches are carried out in succession. In particular, although not shown in detail, a first plasma etch of a dry type enables selective removal of two portions laterally spaced apart, and separate, of the top dielectric coating layer 2204, and a further central portion of the top dielectric coating layer 2204, interposed between the two laterally spaced apart portions. The second etch, which is also a plasma etch of a dry type, enables selective removal of a portion of the semiconductor substrate 2203 arranged underneath the aforementioned central portion of the top dielectric coating layer 2204 so as to form a first preliminary cavity 2240, which passes right through the top dielectric coating layer 2204 and the semiconductor substrate 2203 so as to expose a portion of the bottom dielectric coating layer 2205. The first preliminary cavity 2240 is designed to form the nozzle 240. The remaining part of the top dielectric coating layer 2204 forms the top dielectric region 204. The third etch, which is also a plasma etch of a timed dry type, enables selective removal of portions of the semiconductor substrate 2203 arranged underneath the aforementioned two laterally spaced apart portions of the top dielectric coating layer 2204 so as to form the first and the second cavities 207, 217.

The operations described with reference to FIG. 16 moreover enable formation, together with the first preliminary cavity 2240, of a further pair of preliminary cavities (not illustrated), which are designed to form the first and the second intercell nozzles U1, U2, respectively.

Figure 17:
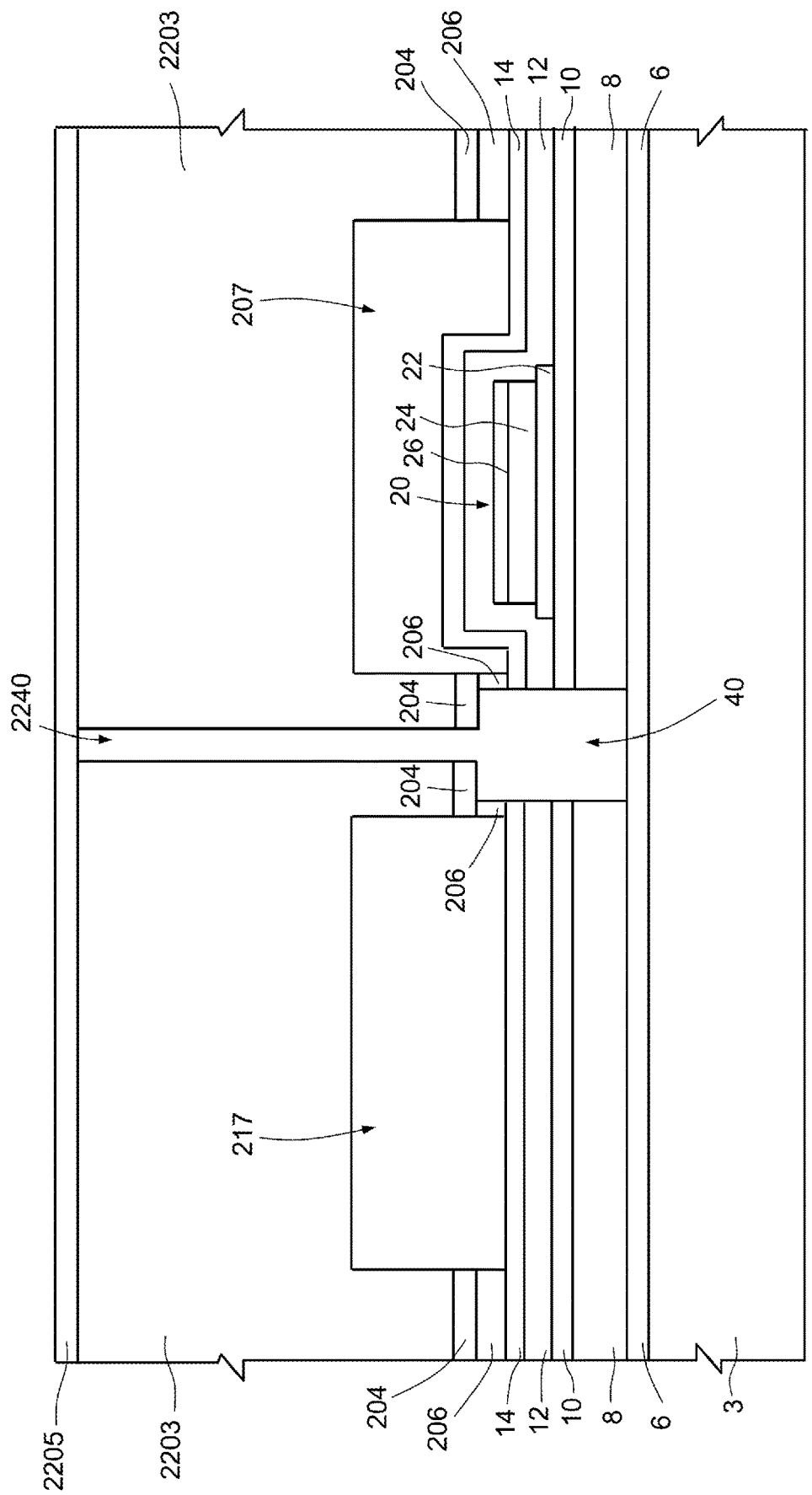
FIGS. 17 to 20 are schematic cross-sectional views of a portion of a composite wafer obtained by gluing the first and the second wafers together.

Next, as illustrated in FIG. 17, the first and the second semiconductor wafers 1500, 2000 are coupled together via interposition of the gluing layer 206, which is initially arranged on the second semiconductor wafer 2000. In particular, coupling is made so that the first cavity 207 overlies the first piezoelectric actuator 20, whereas the second cavity 210 overlies the first and the second intercell piezoelectric actuators A1, A2 (not visible in FIG. 17). Moreover, the first preliminary cavity 2240 communicates with the supply channel 40. Likewise, although not shown, the cavities of the aforementioned pair of preliminary cavities communicate, respectively, with the first and the second intercell nozzles U1, U2.

Figure 18:
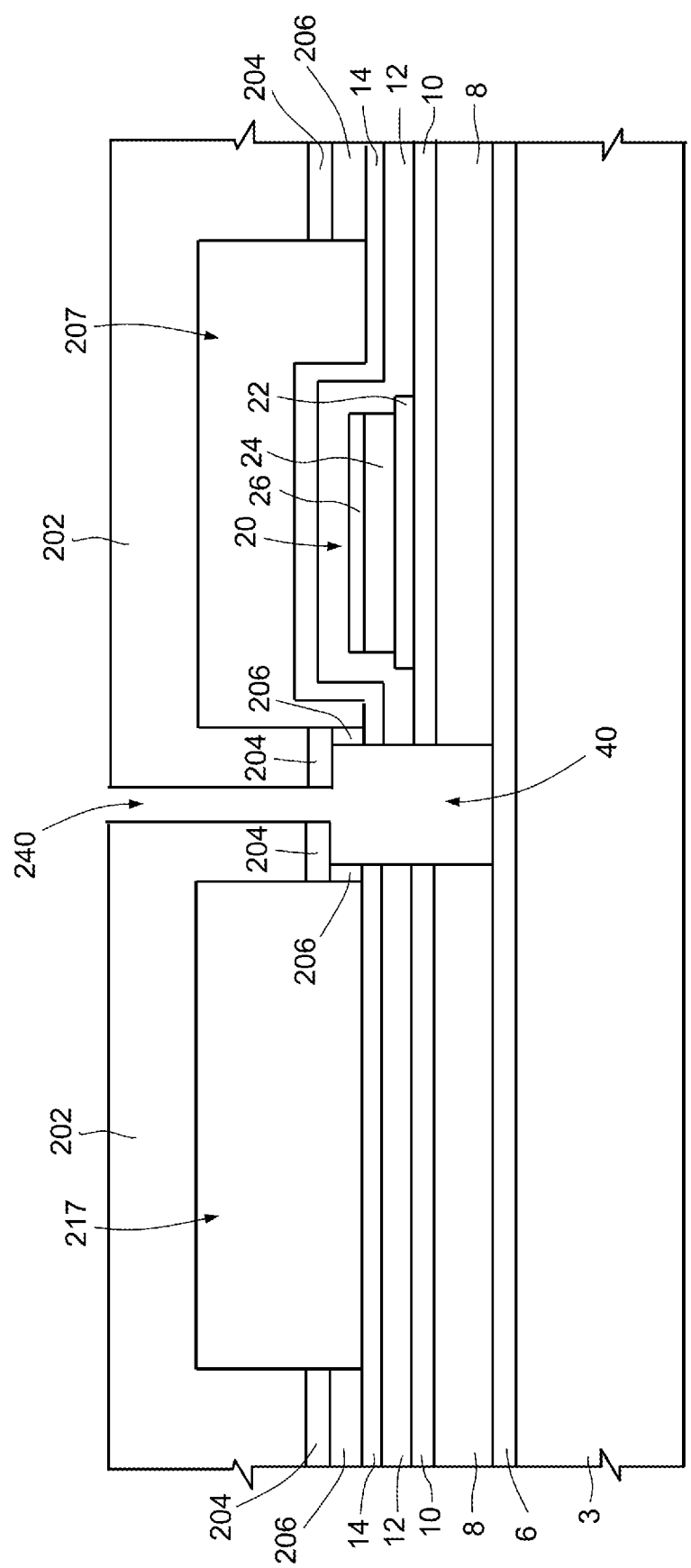

Next, as illustrated in FIG. 18, a mechanical removal is carried out, by grinding, of the bottom dielectric coating layer 2205 and of an underlying portion of the semiconductor substrate 2203, so that the remaining part of the semiconductor substrate 2203 forms the top semiconductor region 202; moreover, in this way, the preliminary cavity 2240 is opened upwards, thus forming the nozzle 240.

Figure 19:
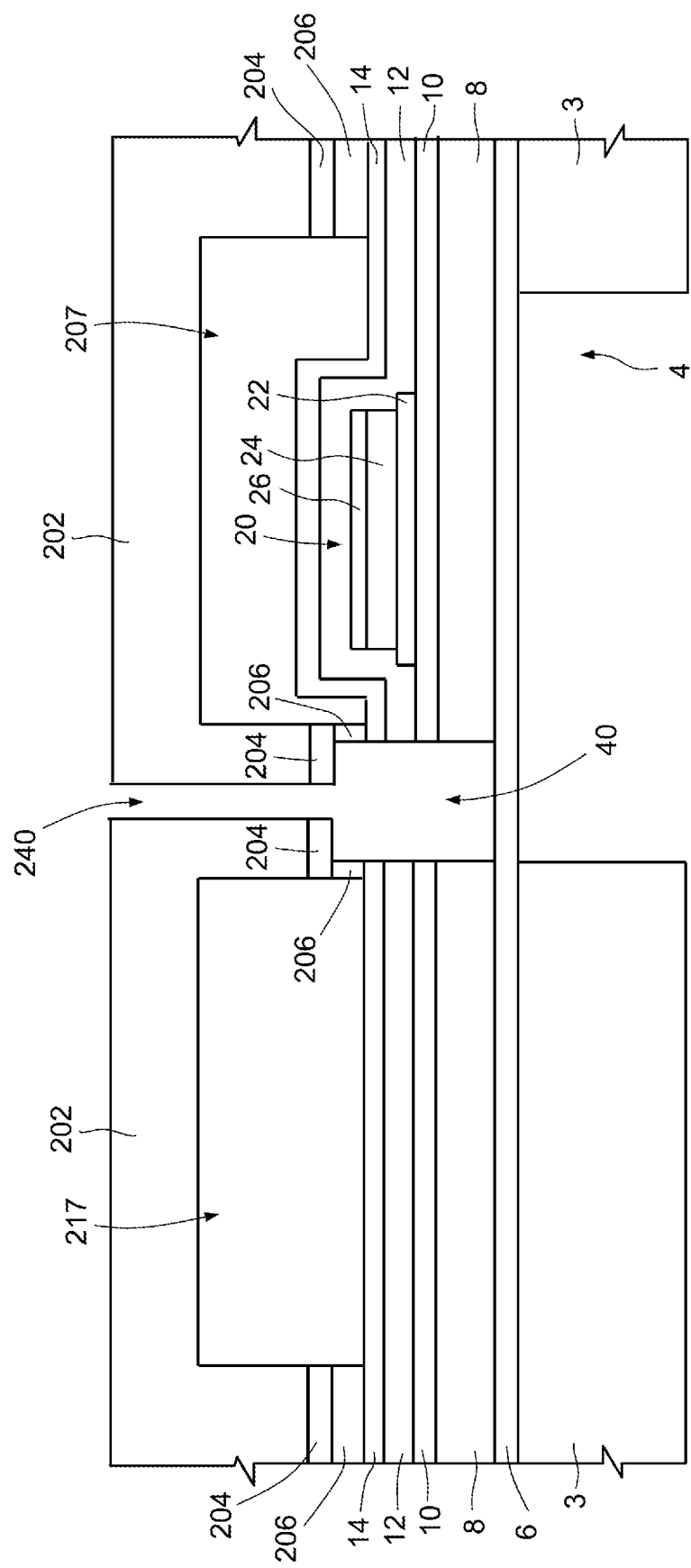

Next, as illustrated in FIG. 19, an etch is carried out from the back so as to enable selective removal of portions of the semiconductor body 3 so as to form the chamber 4 and, although not visible in FIG. 19, the first and the second intercell chambers IC1, IC2. This etch occurs in a manner such that the chamber 4 and the first and second intercell chambers IC1, IC2 have a uniform profile along the Z axis and completely traverse the semiconductor body 3.

Figure 20:
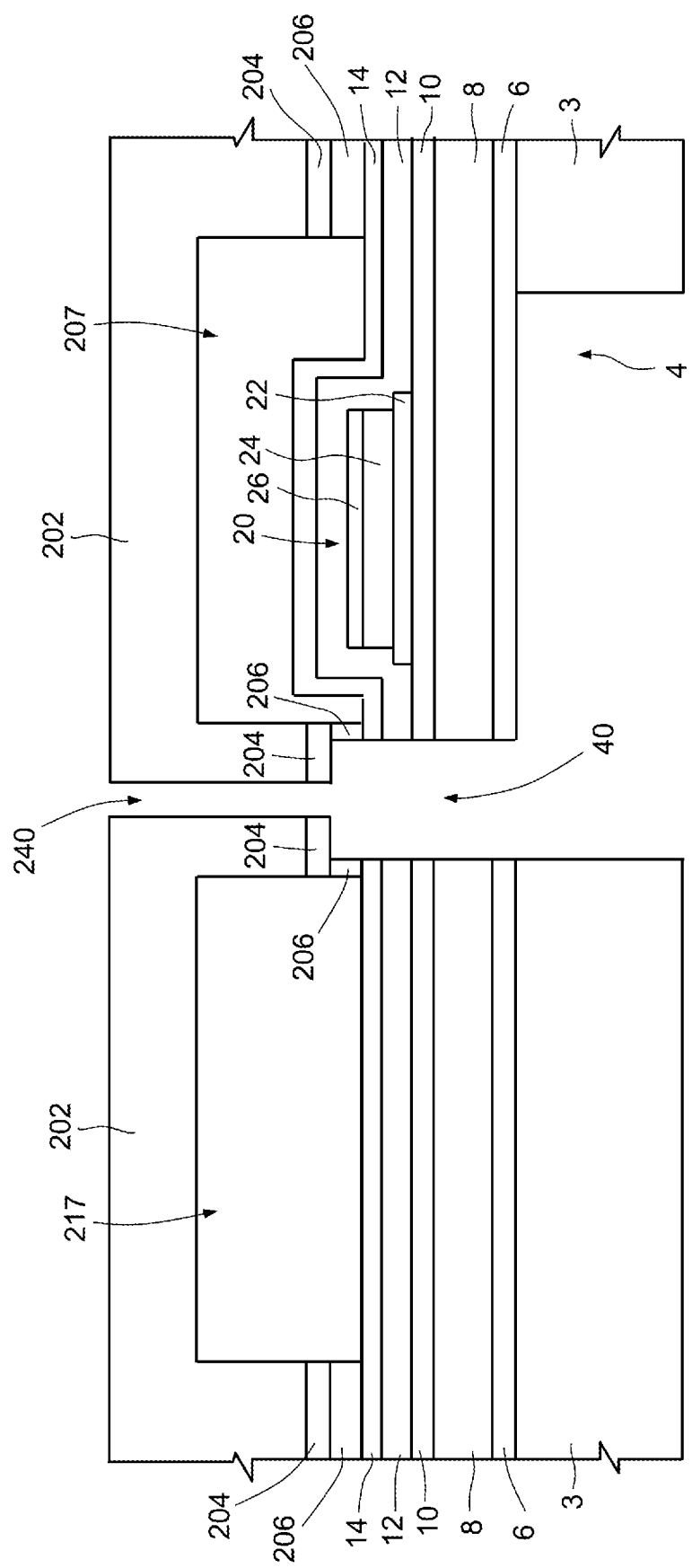

Next, as illustrated in FIG. 20, a plasma etch of a dry type is carried out for selective removal of a portion of the first dielectric layer 6 interposed between the front part of the supply channel 40 and the chamber 4 so as to render them communicating. In practice, this etch enables formation of the part of the supply channel 40 that extends through the first dielectric layer 6.

Even though not shown, the above etch also enables removal of portions of the first dielectric layer 6 interposed between the first and the second intercell supply channels CH1, CH2 and, respectively, the first and the second intercell chambers IC1, IC2.

The manufacturing process may then proceed in a per se known manner and may comprise, for example, so-called dicing operations.

Finally, it is clear that modifications and variations may be made to the microfluidic device and to the manufacturing process described and illustrated herein, without thereby departing from the scope of the present disclosure.

For instance, the materials referred to may be replaced by other materials having similar chemico/physical and/or mechanical properties.

Moreover, the geometrical shapes and the arrangements of the actuators, chambers, supply channels and nozzles may vary with respect to what has been described herein.

In particular, concerning the size of the chambers 4 and the intercell chambers IC1, IC2, they may be much greater than in the case of the "drop-on-demand" devices, wherein the size of the chambers have to be reduced, so as to allow the driving in resonance conditions of the electromechanical system including each membrane and the corresponding chamber. In particular, in this latter case, the size of the chambers have to be strictly correlated with the size of the respective inlets and outlets. On the contrary, the volume of each of the chambers 4 and the intercell chambers IC1, IC2 may be comprised within the range $0.008~mm^3$-$0.01~mm^3$. Furthermore, the height along the Z axis of each of the chambers 4 and the intercell chambers IC1, IC2 may be greater than 300 μm.

In addition, some of the manufacturing steps could vary as regards their order of execution.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microfluidic device, comprising:
   a semiconductor body;
   a main chamber in the semiconductor body, the main chamber being open at a bottom of the main chamber and configured to be coupled without any pressure drop to a hydraulic system configured to fill the main chamber with a fluid;
   an intermediate structure, which includes a main membrane at a top of the main chamber;
   a nozzle body on the intermediate structure;
   a main piezoelectric actuator on the main membrane;
   a main supply channel that traverses the intermediate structure, the main supply channel being positioned laterally adjacent to the main membrane and being in fluidic communication with the main chamber; and
   a main nozzle extending through the nozzle body and in fluidic communication with the main supply channel, wherein:
      the main piezoelectric actuator is configured to be electrically controlled so as to operate in a resting condition, such that the pressure of the fluid within the main chamber is equal to a reference pressure such that said fluid traverses the main supply channel and is ejected from the main nozzle in a continuous stream; and
      the main piezoelectric actuator is configured to be electrically controlled so as to operate in an active condition in which the main piezoelectric actuator causes a deformation of the main membrane and a consequent pressure variation, with respect to the reference pressure, of the pressure of the fluid within the main chamber, said pressure variation causing a temporary interruption of said continuous stream;
   a pair of secondary chambers formed in the semiconductor body and configured to be coupled to the hydraulic system so as to fill the second secondary chambers with fluid;

a pair of secondary membranes formed in the intermediate structure, each secondary membrane at a top of a corresponding secondary chamber of the pair of secondary chambers;

a pair of secondary piezoelectric actuators respectively arranged on a corresponding secondary membrane of the pair of secondary membranes, each secondary piezoelectric actuator being configured to be electrically controlled so as to subject said corresponding secondary membrane to deformation and vary a pressure of the fluid present in the corresponding secondary chamber;

a pair of secondary supply channels that respectively traverse the intermediate structure, each secondary supply channel being laterally adjacent to a corresponding secondary membrane of the pair of secondary membranes and being in fluidic communication with the corresponding secondary chamber; and a pair of secondary nozzles extending through the nozzle body and in fluidic communication with the secondary supply channels, respectively; wherein the main chamber has an axis of symmetry, and the pair of the secondary chambers is symmetrical with respect to said axis of symmetry.

2. The microfluidic device according to claim 1, wherein the main piezoelectric actuator is configured to be electrically controlled to cause curving of the main membrane towards the main chamber and a subsequent elastic return of the main membrane, with consequent curving of said main membrane towards the nozzle body so that the pressure of the fluid within the main chamber initially exceeds the reference pressure and subsequently drops below the reference pressure, so as to cause ejection, through the main nozzle, of a first continuous portion of fluid, which includes an enlarged end portion, and of a subsequent second continuous portion of fluid, separate from the first continuous portion of fluid.

3. The microfluidic device according to claim 1, further comprising a first cavity which extends in the nozzle body, faces the intermediate structure, is laterally spaced apart from the main nozzle, and overlies the main piezoelectric actuator, wherein the nozzle body is fixed to portions of the intermediate structure that are laterally adjacent to and around the main supply channel.

4. The microfluidic device according to claim 1, further comprising a second cavity which extends in the nozzle body, faces the intermediate structure, is laterally spaced apart with respect to the first cavity, and overlies the secondary piezoelectric actuators; wherein the main nozzle and the secondary nozzles are interposed between the first and the second cavities.

5. The microfluidic device according to claim 1, wherein at least part of the main chamber extends between the pair of secondary chambers.

6. The microfluidic device according to claim 1, wherein the main chamber is a first main chamber, the main membrane is a first main membrane, the main piezoelectric actuator is a first main piezoelectric actuator, the main supply channel is a first main supply channel, and the main nozzle is a first main nozzle, the microfluidic device further comprising:

a second main chamber in the semiconductor body, the second main chamber being open at a bottom of the second main chamber and configured to be coupled without any pressure drop to the hydraulic system configured to fill the second main chamber with the fluid;

a second main membrane that is in the intermediate structure and at a top of the second main chamber, wherein the nozzle body overlies the second intermediate structure;

a second main piezoelectric actuator arranged on the second main membrane, the second main piezoelectric actuator being configured to be electrically controlled so as to subject said second main membrane to deformation and vary a pressure of the fluid present in the second main chamber;

a second main supply channel that traverses the second intermediate structure, the second main supply channel being positioned laterally adjacent to the main membrane and being in fluidic communication with the main chamber; and a second main nozzle extending through the nozzle body and in fluidic communication with the second main supply channel, wherein one of the plurality of secondary supply channels is positioned between the first and second main supply channels.

7. A system comprising:
a microfluidic device that includes:
a semiconductor body;
a plurality of main chambers in the semiconductor body;
an intermediate structure, which includes a plurality of main membranes, each of which is at an end of a corresponding main chamber of the plurality of main chambers defined by a surface of the intermediate structure; and
a nozzle body which overlies the intermediate structure;
a plurality of main nozzles extending through the nozzle body;
a plurality of main piezoelectric actuators respectively on corresponding main membranes of the plurality of main membranes;
a plurality of main supply channels that respectively traverse the intermediate structure, each one of the plurality of main supply channels being positioned laterally adjacent to a corresponding main membrane of the plurality of main membranes, being between the corresponding main chamber and a corresponding main nozzle of the plurality of nozzles, being in direct fluidic communication with the corresponding main chamber, and being in direct fluidic communication with the corresponding main nozzle; and
a hydraulic system configured to fill the main chambers with a fluid, the hydraulic system including a basin in direct fluidic communication with the plurality of main chambers, the hydraulic system being configured to supply the plurality of main chambers with the fluid and keep the fluid in the basin at a pressure equal to a reference pressure, wherein:
each main piezoelectric actuator is configured to be electrically controlled so as to operate in a resting condition, such that the pressure of the fluid within the corresponding main chamber is equal to the reference pressure such that said fluid traverses the corresponding main supply channel and is ejected from the corresponding main nozzle in a continuous stream; and
each main piezoelectric actuator is configured to be electrically controlled so as to operate in an active condition in which the main piezoelectric actuator causes a deformation of the corresponding main membrane and a consequent pressure variation, with respect to the reference pressure, of the pressure of the fluid within the corresponding main chamber, said pressure variation causing a temporary interruption of said continuous stream.

8. The system according to claim 7, wherein each main piezoelectric actuator is configured to be electrically controlled to cause curving of the corresponding main membrane towards the corresponding main chamber and a subsequent elastic return of the corresponding main membrane, with consequent curving of said corresponding main membrane towards the nozzle body so that the pressure of the fluid within the corresponding main chamber initially exceeds the reference pressure and subsequently drops below the reference pressure, so as to cause ejection, through the corresponding main nozzle, of a first continuous portion of fluid, which includes an enlarged end portion, and of a subsequent second continuous portion of fluid, separate from the first continuous portion of fluid.

9. The system according to claim 7, wherein the microfluidic device includes a first cavity which extends in the nozzle body, faces the intermediate structure, is laterally spaced apart from the main nozzles, and overlies the main piezoelectric actuators; wherein the nozzle body is fixed to portions of the intermediate structure that are laterally adjacent to and around the main supply channels.

10. The system according to claim 7, wherein the main chambers are open, in a direction opposite to the main nozzles, to the basin.

11. The system according to claim 7, wherein the microfluidic device includes:
a plurality of secondary chambers in the semiconductor body and configured to be coupled to the hydraulic system so as to fill the second secondary chambers with fluid;
a plurality of secondary membranes in the intermediate structure, each secondary membrane at a top of a corresponding secondary chamber of the plurality of secondary chambers;
a plurality of secondary piezoelectric actuators respectively arranged on a corresponding secondary membrane of the plurality of secondary membranes, each main piezoelectric actuator being configured to be electrically controlled so as to subject said corresponding secondary membrane to deformation and vary a pressure of the fluid present in the corresponding secondary chamber;
a plurality of secondary supply channels that respectively traverse the intermediate structure, each secondary supply channel being laterally adjacent to a corresponding secondary membrane of the plurality of secondary membranes and being in fluidic communication with the corresponding secondary chamber; and
a plurality of secondary nozzles extending through the nozzle body and in fluidic communication with the secondary supply channels, respectively; wherein each main chamber has an axis of symmetry, and a pair of the secondary chambers is symmetrical with respect to said axis of symmetry.

12. The system according to claim 11, wherein the microfluidic device includes a second cavity, which extends in the nozzle body, faces the intermediate structure, is laterally spaced apart with respect to the first cavity, and overlies the secondary piezoelectric actuators; wherein the main nozzles and the secondary nozzles are interposed between the first and the second cavities.

13. The system according to claim 11, wherein at least part of each main chamber extends between the pair of secondary chambers.

14. A microfluidic device, comprising:
a semiconductor body including a first surface and a second surface opposite to the first surface;
a plurality of chambers extending through the semiconductor body from the first surface to the second surface in a first direction directed from the first surface to the second surface, each of the plurality of chambers including:
a first portion with a first diameter;
a second portion with a second diameter smaller than the first diameter; and
a connecting portion extending from the first portion to the second portion through which the first portion is in fluidic communication with the second portion;
an intermediate structure on the semiconductor body;
a plurality of supply channels extending into the intermediate structure, each one of the plurality of supply channels extends to one of the second portions the plurality of chambers in the first direction and is in fluid communication with the one of the second portions of the plurality of the plurality of chambers;
a nozzle structure on the intermediate structure;
a plurality of nozzles extend through the nozzle structure, each one of the plurality of nozzles extends in the first direction to one of the plurality of supply channels;
wherein ones of the second portions of the plurality of chambers are between a pair of adjacent ones of the second portions of the plurality of chambers, and ones of the plurality of nozzles are offset relative to a pair of adjacent ones of the plurality of nozzles.

15. The microfluidic device of claim 14, wherein the intermediate structure includes a plurality of membrane portions, each one of the plurality of membrane portions that overlaps one of the first portions of the plurality of chambers.

16. The microfluidic device of claim 15, further comprising a plurality of piezoelectric actuators, each one of the plurality of piezoelectric actuators overlaps one of the first portions of the plurality of chambers.

17. The microfluidic device of claim 15, wherein the intermediate structure includes a dielectric layer, and the dielectric layer is on and covers the plurality of piezoelectric actuators.

18. The microfluidic device of claim 14, wherein adjacent ones of the first portions of the plurality of chambers are spaced apart from each other by a distance less than the second diameters of the second portions of the plurality of chambers.

19. The microfluidic device of claim 14, wherein:
the semiconductor body further includes a plurality of first sidewall portions and a plurality of second sidewall portions, each one of the plurality of second sidewall portions is opposite to one of plurality of first sidewall portions, the plurality of first sidewall portions and the plurality of second sidewall portions are transverse to the first surface and the second surface of the semiconductor body; and
each one of the connecting portions of the plurality of chambers extends from one of the first portions of the plurality of chambers to one of the second portions of the plurality of chambers in a first direction, each one of the connecting portions has a dimension that extends in a second direction from one of the plurality of first sidewall portions to one of the plurality of second sidewall portions, the second direction is transverse to the first direction, and the dimension is substantially equal to the second diameters of the second portions of the plurality of chambers.

20. The system of claim 7, wherein the corresponding main nozzle is spaced laterally outward from the corresponding membrane, is in line with the corresponding main supply channel, and is in line with a secondary chamber of the corresponding main chamber.

\* \* \* \* \*